(12) United States Patent
Sung et al.

(10) Patent No.: US 11,069,814 B2
(45) Date of Patent: Jul. 20, 2021

(54) TRANSISTOR HAVING VERTICAL STRUCTURE AND ELECTRIC DEVICE

(71) Applicant: LG DISPLAY CO., LTD., Seoul (KR)

(72) Inventors: SangYun Sung, Gyeonggi-do (KR); SeHee Park, Seoul (KR); Jiyong Noh, Gyeonggi-do (KR); InTak Cho, Gyeonggi-do (KR); PilSang Yun, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 28 days.

(21) Appl. No.: 16/575,077

(22) Filed: Sep. 18, 2019

(65) Prior Publication Data

US 2020/0161476 A1  May 21, 2020

(30) Foreign Application Priority Data

Nov. 16, 2018 (KR) .................... 10-2018-0141298

(51) Int. Cl.
*H01L 29/786* (2006.01)
*H01L 27/12* (2006.01)
(Continued)

(52) U.S. Cl.
CPC .... *H01L 29/78642* (2013.01); *H01L 27/1214* (2013.01); *H01L 29/42384* (2013.01);
(Continued)

(58) Field of Classification Search
CPC ........... H01L 29/78642; H01L 27/1214; H01L 29/42384; H01L 29/4908; H01L 29/78696; H01L 29/7869
See application file for complete search history.

(56) References Cited

U.S. PATENT DOCUMENTS 5,574,294 A   11/1996   Shepard
5,780,911 A    7/1998   Park et al.
(Continued)

FOREIGN PATENT DOCUMENTS

JP   4-207039 A    7/1992
JP   8-148685 A    6/1996
(Continued)

*Primary Examiner* — Stephen W Smoot
*Assistant Examiner* — Vicki B. Booker
(74) *Attorney, Agent, or Firm* — Birch, Stewart, Kolasch & Birch, LLP

(57) ABSTRACT

An electronic device can include a panel; a driver circuit configured to drive the panel; and a transistor disposed in the panel, the transistor including: a gate electrode disposed on a substrate, a first insulating film disposed on the gate electrode, an active layer disposed on the first insulating film, the active layer including: a first portion of the active layer overlapping with an upper surface of the gate electrode, a second portion of the active layer extending from the first portion, being disposed along a side surface of the gate electrode and including a channel area, and a third portion of the active layer extending from the second portion of the active layer, the third portion of the active layer being disposed on a portion of the first insulating film that does not overlap with the gate electrode, a second insulating film disposed on the active layer, a first electrode disposed on the second insulating film, the first electrode being electrically connected to the first portion of the active layer, and a second electrode disposed on the second insulating film, the second electrode being electrically connected to the third portion of the active layer.

24 Claims, 17 Drawing Sheets

(51) Int. Cl.
*H01L 29/423* (2006.01)
*H01L 29/49* (2006.01)
(52) U.S. Cl.
CPC .... *H01L 29/4908* (2013.01); *H01L 29/78696* (2013.01); *H01L 29/7869* (2013.01)

(56) References Cited

U.S. PATENT DOCUMENTS

| | | | |
|---|---|---|---|
| 8,946,070 B2* | 2/2015 | Tutt | H01L 21/28026 |
| | | | 438/586 |
| 9,153,698 B2* | 10/2015 | Nelson | H01L 29/78642 |
| 2005/0239238 A1 | 10/2005 | Schuele et al. | |
| 2007/0126683 A1* | 6/2007 | Sung | G09G 3/3233 |
| | | | 345/92 |
| 2012/0175614 A1 | 7/2012 | Tutt et al. | |
| 2015/0380563 A1* | 12/2015 | Park | H01L 27/1251 |
| | | | 257/43 |

FOREIGN PATENT DOCUMENTS

| | | |
|---|---|---|
| JP | 2008-60522 A | 3/2008 |
| TW | 301801 B | 4/1997 |

* cited by examiner

TRANSISTOR HAVING VERTICAL STRUCTURE AND ELECTRIC DEVICE

CROSS REFERENCE TO RELATED APPLICATION

This application claims priority to Korean Patent Application No. 10-2018-0141298, filed in the Republic of Korea on Nov. 16, 2018, which is hereby incorporated by reference for all purposes as if fully set forth herein.

BACKGROUND

Field

Example embodiments relate to a transistor having a vertical structure and an electronic device.

Description of Related Art

In response to the development of the information society, a variety of demands for a range of electronic devices, such as a display device and a lighting device, are increasing. Such an electronic device may include a panel in which data lines and gate lines are disposed, a data driver driving the data lines, and a gate driver driving the gate lines.

A panel, a key component of an electronic device may include a large number of transistors having a variety of functions to drive the panel.

Accordingly, panel fabrication processing may inevitably be complicated and difficult. However, if ease of processing is pursued, the performance of transistors may be degraded, which is problematic.

In addition, transistors should have high levels of integration to realize superior characteristics in electronic devices, such as high resolution. However, the area of transistors cannot be endlessly reduced, due to problems associated with processing, design, and the like. Therefore, it is desirable to adjust an area occupied by transistors without degrading the characteristics of transistors.

BRIEF SUMMARY

Various aspects of the present disclosure provide a transistor having a vertical structure and an electronic device, in which an active layer has no break, e.g., no discontinuity in an electrical circuit.

Also provided are a transistor having a vertical structure and an electronic device, in which the contact resistance between a source/drain electrode and an active layer is lowered.

Also provided are a transistor having a vertical structure and an electronic device, in which a short channel and integration can be realized.

Also provided are a transistor having a vertical structure and an electronic device, in which unnecessary parasitic capacitance is reduced.

Also provided are a transistor having a vertical structure and an electronic device, in which superior process convenience, channel damage protection, a short channel, and device miniaturization can all be realized.

According to an aspect of the present disclosure, an electronic device can include a panel and a driver circuit driving the panel.

In the electronic device, a transistor can be disposed in the panel. The transistor can include: a gate electrode disposed on a substrate; a first insulating film disposed to cover the gate electrode; and an active layer disposed on the first insulating film. The active layer may include: a first portion overlapping a top surface of the gate electrode; a second portion extending from the first portion, located on a side surface of the gate electrode, and including a channel area; and a third portion extending from the second portion and located on a portion of the first insulating film, on which the gate electrode is not disposed. The active layer can also include: a second insulating film disposed on the active layer; a first electrode disposed on the second insulating film and electrically connected to the first portion of the active layer; and a second electrode disposed on the second insulating film and electrically connected to the third portion of the active layer. The side surface of the gate electrode can have a reverse tapered shape or one or more stepped portions on an area corresponding to the second portion of the active layer.

An insulation pattern can be disposed between the active layer and the second insulating film, in an area corresponding to at least one side surface of the gate electrode.

The insulation pattern can overlap the channel area of the active layer.

The width of the insulation pattern can be wider than the width of the channel area of the active layer.

The gate electrode can have a single-layer structure or a multi-layer structure.

In a situation in which the gate electrode has a single-layer structure, the width of the gate electrode can increase in a direction away from the substrate.

In a situation in which the gate electrode has a double-layer structure, the gate electrode can include a first gate electrode and a second gate electrode disposed on the first gate electrode, the width of the first gate electrode being narrower than the width of the second gate electrode. The channel area of the active layer can be disposed to correspond to a portion of the side surface of the first gate electrode.

In a situation in which the gate electrode has a triple-layer structure, the gate electrode can further include a third gate electrode disposed below the first gate electrode, the width of the first gate electrode being narrower than the width of the third gate electrode. The channel area of the active layer can be disposed to correspond to a portion of the side surface of the gate electrode.

One of the first electrode and the second electrode can overlap the gate electrode, while the first electrode and the second electrode do not overlap each other.

One of the first electrode and the second electrode can be a source electrode, and the other of the first electrode and the second electrode can be a drain electrode.

The transistor can be disposed in each area of a plurality of subpixels in an active area of the panel.

In addition, the transistor can be included in a gate driver circuit disposed in a non-active area of the panel, in a periphery of the active area.

According to exemplary embodiments, in the transistor having a vertical structure and the electronic device, the active layer has no break, e.g., no discontinuity in an electrical circuit.

According to example embodiments, in the transistor having a vertical structure and the electronic device, the contact resistance between the source/drain electrode and the active layer is lowered.

According to example embodiments, in the transistor having a vertical structure and the electronic device, a short channel and integration can be realized.

According to example embodiments, in the transistor having a vertical structure and the electronic device, unnecessary parasitic capacitance is reduced.

According to example embodiments, in the transistor having a vertical structure and the electronic device, superior process convenience, channel damage protection, a short channel, and device miniaturization can be realized.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION OF THE EMBODIMENTS

Figure 1:
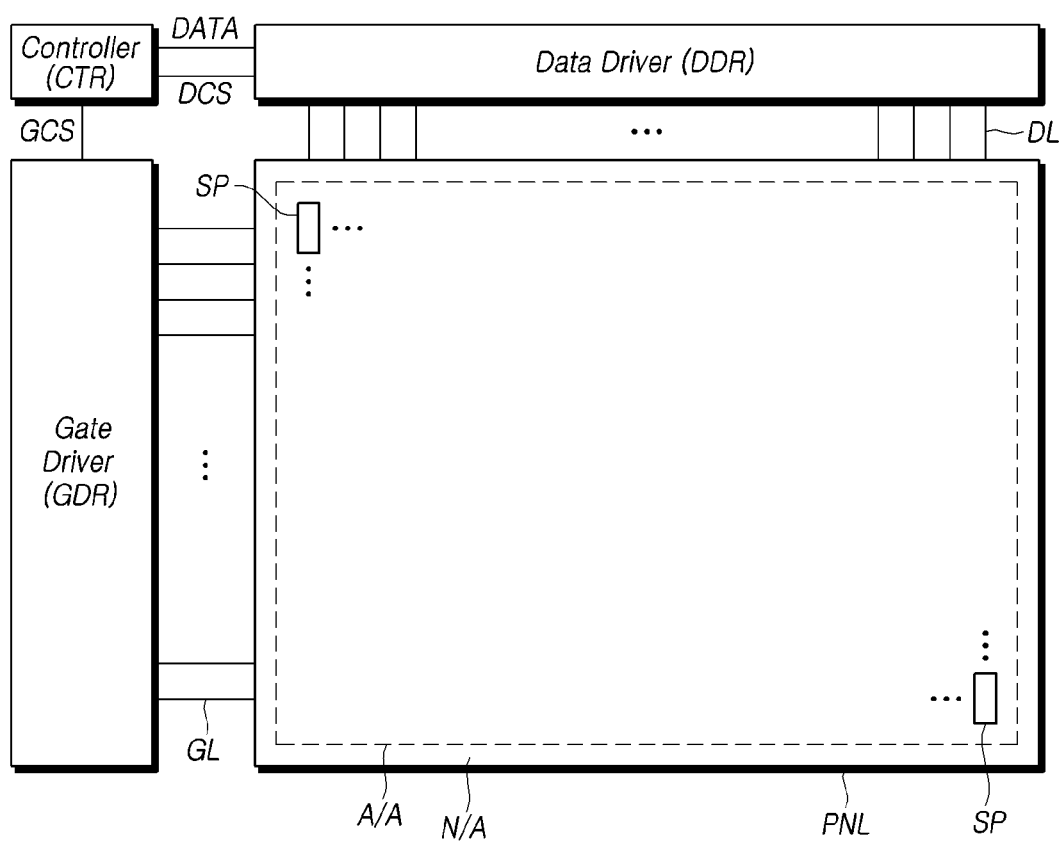
FIG. 1 illustrates a schematic configuration of an electronic device according to embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the situation that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

FIG. 1 illustrates a schematic configuration of an electronic device according to example embodiments.

The electronic device according to embodiments can include a display device, a lighting device, a light-emitting device, and the like. The following description will mainly be focused on the display device for the sake of brevity. However, the following description may be applied not only to the display device, but also to various other electronic devices, such as the lighting device or the light-emitting device, in substantially the same manner, as long as transistors are included.

The electronic device according to embodiments can include a panel PNL displaying images or emitting light and driver circuits driving the panel PNL.

In the panel PNL, a plurality of data lines DL and a plurality of gate lines GL can be disposed, and a plurality of subpixels SP, defined by intersections of the plurality of gate lines and the plurality of data lines, can be arrayed in the form of a matrix.

In the panel PNL, the plurality of data lines DL and the plurality of gate lines GL can be disposed to intersect each other. For example, the plurality of gate lines GL can be arrayed in rows or columns, while the plurality of data lines DL can be arrayed in columns or rows. In the following description, the plurality of gate lines GL will be regarded as being arrayed in rows, while the plurality of data lines DL will be regarded as being arrayed in columns, for the sake of brevity.

Various signal lines, other than the plurality of data lines DL and the plurality of gate lines GL, can be disposed in the panel PNL, depending on the subpixel structure or the like. Driving voltage lines, reference voltage lines, common voltage lines, and the like can further be disposed.

The panel PNL can be one of various types of panels, such as a liquid crystal display (LCD) panel and an organic light-emitting diode (OLED) panel.

Types of signal lines disposed in the panel PNL can vary depending on the subpixel structure, the panel type (e.g., an LCD panel or an OLED panel), or the like. In addition, the term "signal lines" used herein can conceptually include electrodes to which signals are applied.

The panel PNL can include an active area A/A in which images are displayed and a non-active area N/A in which no images are displayed, the non-active area N/A being located in the periphery of the active area A/A. Herein, the non-active area N/A is also referred to as a bezel area.

The plurality of subpixels SP are displaying images are disposed in the active area A/A.

A pad assembly can be disposed in the non-active area N/A, with a data driver DDR being electrically connected to the pad assembly. A plurality of data link lines connecting the pad assembly and the plurality of data lines DL can be disposed in the non-active area N/A. Herein, the plurality of data link lines can be extensions of the plurality of data lines DL into the non-active area N/A or separate patterns electrically connected to the plurality of data lines DL.

In addition, gate driving-related lines may be disposed in the non-active area N/A to transfer voltages (or signals) for gate driving to a gate driver GDR via the pad assembly to which the data driver DDR is electrically connected. For example, the gate driving-related lines can include clock lines, through which clock signals are transferred, gate voltage lines, through which gate voltages VGH and VGL are transferred, gate driving control signal lines, through which a variety of control signals for the generation of a scanning signal are transferred, and the like. These gate driving-related lines are disposed in the non-active area N/A, unlike the gate lines GL disposed in the active area A/A.

The driver circuits driving the plurality of data lines DL can include the data driver DDR driving the plurality of data lines DL, the gate driver GDR driving the plurality of gate lines GL, a controller CTR controlling the data driver DDR and the gate driver GDR, and the like.

The data driver DDR can drive the plurality of data lines DL by outputting data voltages to the plurality of data lines DL.

The gate driver GDR can drive the plurality of gate lines GL by outputting a scanning signal to the plurality of gate lines GL.

The controller CTR can control the driving operations of the data driver DDR and the gate driver GDR by supplying a variety of control signals DCS and GCS for the driving operations of the data driver DDR and the gate driver GDR. In addition, the controller CTR can supply image data DATA to the data driver DDR.

The controller CTR starts scanning at points in time realized by respective frames, converts image data input from an external source into image data DATA having a data signal format readable by the data driver DDR, outputs the converted image data DATA, and controls data driving at appropriate points in time according to the scanning.

The controller CTR receives timing signals, including a vertical synchronization signal Vsync, a horizontal synchronization signal Hsync, an input data enable signal DE, a clock signal CLK, and the like, from an external source (e.g., a host system), generates a variety of control signals, and outputs the variety of control signals to the data driver DDR and the gate driver GDR in order to control the data driver DDR and the gate driver GDR.

For example, the controller CTR outputs a variety of gate control signals GCS, including a gate start pulse GSP, a gate shift clock GSC, a gate output enable signal GOE, and the like, to control the gate driver GDR.

In addition, the controller CTR outputs a variety of data control signals DCS, including a source start pulse SSP, a source sampling clock SSC, a source output enable signal SOE, and the like, to control the data driver DDR.

The controller CTR can be a timing controller used in a typical display device, or can be a control device including a timing controller and performing other control functions.

The controller CTR can be provided as a component separate from the data driver DDR, or can be provided as an integrated circuit (IC) integrated (or combined) with the data driver DDR.

The data driver DDR receives image data DATA from the controller CTR and supplies data voltages to the plurality of data lines DL to drive the plurality of data lines DL. The data driver DDR is also referred to as a source driver.

The data driver DDR can send and receive a variety of signals to and from the controller CTR via a variety of interfaces.

The gate driver GDR sequentially drives the plurality of gate lines GL by sequentially supplying a scanning signal to the plurality of gate lines GL. Herein, the gate driver GDR is also referred to as a scan driver.

The gate driver GDR sequentially supplies the scanning signal having an on or off voltage to the plurality of gate lines GL, under the control of the controller CTR.

If a specific gate line is opened by the gate driver GDR, the data driver DDR converts the image data DATA, received from the controller CTR, into analog data voltages, and supplies the data voltages to the plurality of data lines DL.

The data driver DDR can be disposed on one side of the panel PNL (e.g., above or below the panel PNL). In some situations, the data driver DDR can be disposed on both sides of the panel PNL (e.g., above and below the panel PNL), depending on the driving system, the design of the panel, or the like.

The gate driver GDR can be disposed on one side of the panel PNL (e.g., to the right or left of the panel PNL). In some situations, the gate driver GDR can be disposed on both sides of the panel PNL (e.g., to the right and left of the panel PNL), depending on the driving system, the design of the panel, or the like.

The data driver DDR can include one or more source driver ICs (SDICs).

Each of the source driver ICs can include a shift register, a latch circuit, a digital-to-analog converter (DAC), an output buffer, and the like. In some situations, the data driver DDR can further include one or more analog-to-digital converters (ADCs).

Each of the source driver ICs can be connected to a bonding pad of the panel PNL by tape-automated bonding (TAB) or by a chip-on-glass (COG) method, or can directly mounted on the panel PNL. In some situations, each of the source driver ICs can be integrated with the panel PNL. In addition, each of the source driver ICs can be implemented using a chip-on-film (COF) structure. In this situation, each of the source driver ICs can be mounted on a circuit film to be electrically connected to the data lines DL in the panel PNL via the circuit film.

The gate driver GDR can include a plurality of gate driver circuits (GDCs). Herein, the plurality of gate driver circuits may correspond to the plurality of gate lines GL, respectively.

Each of the gate driver circuits can include a shift register, a level register, and the like.

Each of the gate driver circuits can be connected to a bonding pad of the panel PNL by TAB or by a COG method. In addition, each of the gate driver circuits can be implemented using a COF structure. In this situation, each of the gate driver circuits can be mounted on a circuit film to be electrically connected to the gate lines GL in the panel PNL via the circuit film. In addition, each of the gate driver circuits can be implemented using gate-in-panel (GIP) structure disposed within the panel PNL. That is, each of the gate driver circuits may be directly provided in the panel PNL.

Figure 2:
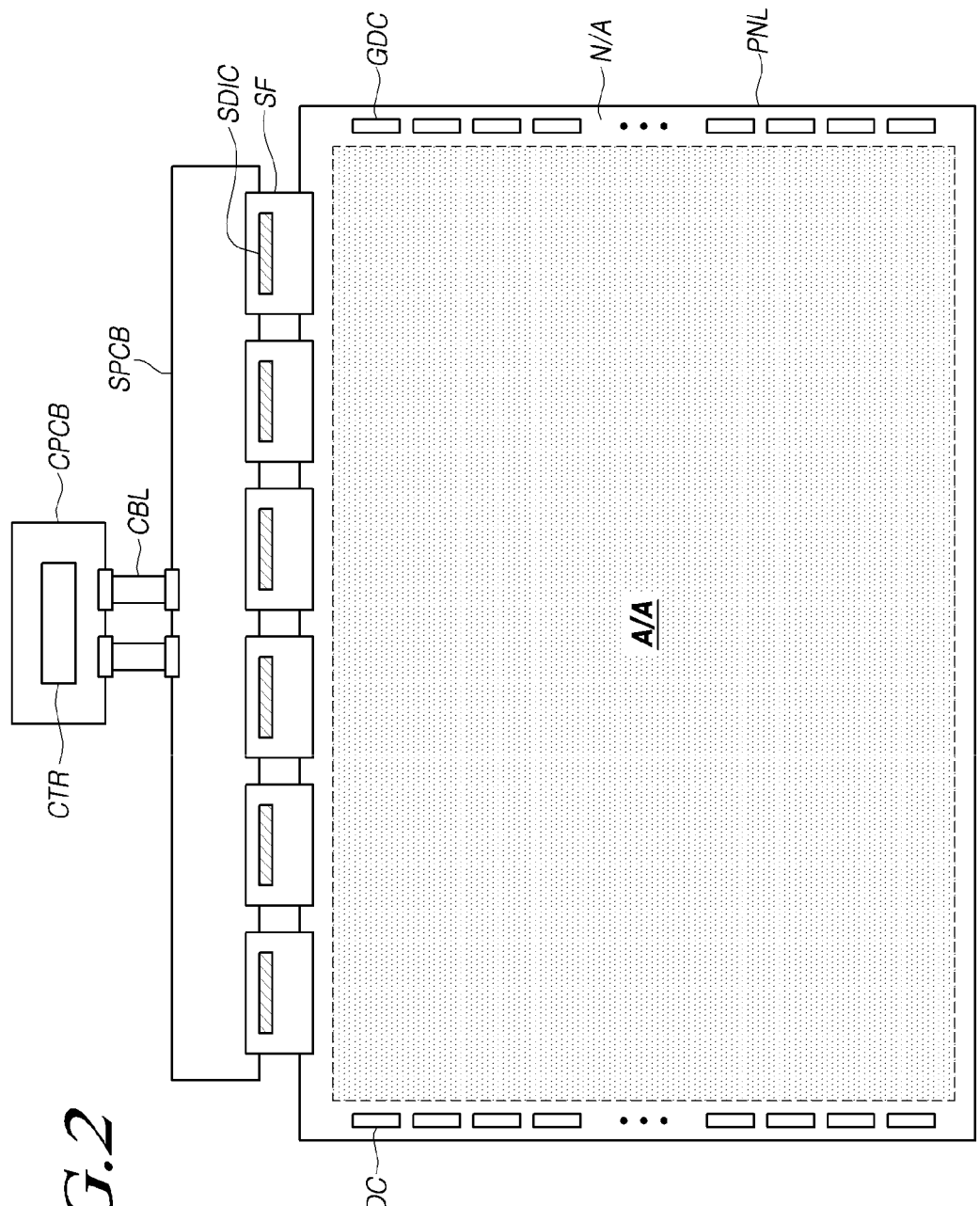
FIG. 2 illustrates a system of the electronic device according to embodiments.

FIG. 2 illustrates a system of the electronic device according to embodiments.

Referring to FIG. 2, in the electronic device according to embodiments, the data driver DDR can be implemented using a COF structure among a plurality of structures, such as a TAB structure, a COG structure, and a COF structure, while the gate driver GDR can be implemented using a GIP structure among a variety of structures, such as a TAB structure, a COG structure, a COF structure, and a GIP structure.

The data driver DDR can be comprised of one or more source driver ICs SDIC. In FIG. 2, the data driver DDR is illustrated as being comprised of a plurality source driver ICs SDIC.

In a situation in which the data driver DDR has the COF structure, each of the source driver ICs SDIC of the data driver DDR can be mounted on a corresponding one of source-side circuit films SF.

One portion of each of the source-side circuit films SF may be electrically connected to the pad assembly (e.g., the assembly of pads) present in the non-active area N/A of the panel PNL.

Lines, electrically connecting the source driver ICs SDIC and the panel PNL, can be disposed on the source-side circuit films SF.

The electronic device can include at least one source printed circuit board SPCB and a control printed circuit board CPCB, on which control components and a variety of electric devices are mounted, in order to circuitry-connect the plurality of source driver ICs SDIC to the other devices.

The other portion of each of the source-side circuit films SF, on which the source driver IC SDICs are mounted, can be connected to the at least one source printed circuit board SPCB.

That is, one portion of each of the source-side circuit films SF, on which the source driver ICs SDIC are mounted, can be electrically connected to the non-active area N/A of the panel PNL, while the other portion of each of the source-side circuit films SF can be electrically connected to the source printed circuit board SPCB.

The controller CTR, controlling the operation of the data driver DDR, the gate driver GDR, and the like, can be disposed in the control printed circuit board CPCB.

In addition, a power management IC (PMIC) or the like can be disposed on the control printed circuit board CPCB. The power management IC supplies various forms of voltage or current to the panel PNL, the data driver DDR, the gate driver GDR, and the like, or controls various forms of voltage or current to be supplied to the same.

The source printed circuit board SPCB and the control printed circuit board CPCB can be circuitry-connected to each other via at least one connector CBL. The connector CBL can be, for example, a flexible printed circuit (FPC), a flexible flat cable (FFC), or the like.

The at least one source printed circuit board SPCB and the control printed circuit board CPCB can be integrated (or combined) into a single printed circuit board.

In a situation in which the gate driver GDR is implemented using a GIP structure, a plurality of gate driver circuits GDC of the gate driver GDR can be directly disposed in the non-active area N/A of the panel PNL.

Each of the plurality of gate driver circuits GDC can output a scanning signal SCAN to a corresponding gate line GL among the plurality of gate lines GL disposed in the active area A/A of the panel PNL.

The plurality of gate driver circuits GDC disposed on the panel PNL can be supplied with a variety of signals (e.g., a clock signal, a high-level gate voltage VGH, a low-level gate voltage VGL, a start signal VST, a reset signal RST, and the like), for the generation of the scanning signal, via the gate driving-related lines disposed in the non-active area N/A.

The gate driving-related lines disposed in the non-active area N/A can be electrically connected to certain source-side circuit films SF disposed closest to the plurality of gate driver circuits GDC.

Figure 3:
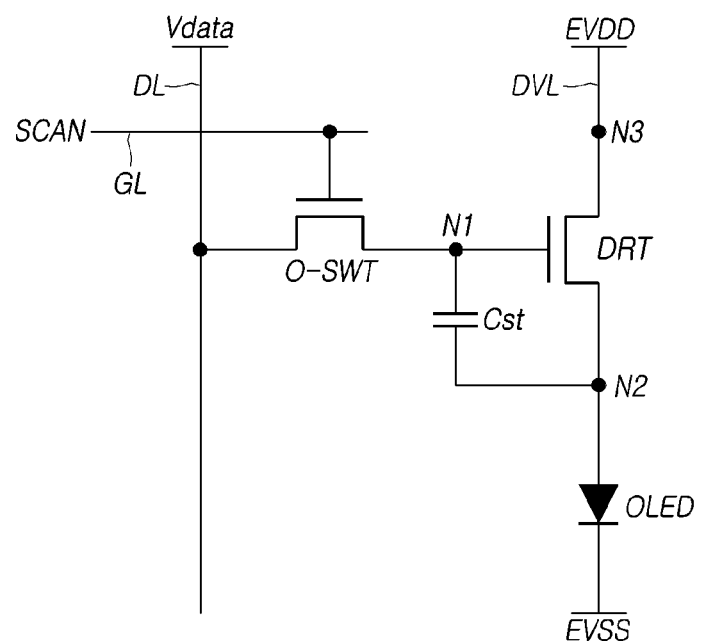
FIG. 3 illustrates a subpixel including a third-type transistor in a situation in which the panel according to embodiments is an organic light-emitting diode (OLED) panel.

FIG. 3 illustrates a structure of a subpixel SP in the panel PNL according to embodiments in a situation in which the panel PNL is an OLED panel.

Referring to FIG. 3, each of the subpixels SP in the OLED panel PNL can include an organic light-emitting diode OLED, a driving transistor DRT driving the organic light-emitting diode OLED, a switching transistor O-SWT electrically connected between a first node N1 of the driving transistor DRT and a corresponding data line DL, a storage capacitor Cst electrically connected to a first node and a second node N2 of the driving transistor DRT, and the like.

The organic light-emitting diode OLED can include an anode, an organic light-emitting layer, a cathode, and the like.

Referring to the circuit in FIG. 3, the anode (also referred to as a pixel electrode) of the organic light-emitting diode OLED may be electrically connected to the second node N2 of the driving transistor DRT. The cathode (also referred to as a common electrode) of the organic light-emitting diode OLED can have a base voltage EVSS applied thereto.

Herein, the base voltage EVSS can be, for example, a ground voltage or a voltage higher or lower than the ground voltage. In addition, the base voltage EVSS can vary, depending on the driving state. For example, the base voltage EVSS, during image driving, and the base voltage EVSS, during sensing driving may be set differently.

The driving transistor DRT drives the organic light-emitting diode OLED by supplying a driving current to the organic light-emitting diode OLED.

The driving transistor DRT can include the first node N1, the second node N2, a third node N3, and the like.

The first node N1 of the driving transistor DRT can be a gate node, and can be electrically connected to a source node or a drain node of the switching transistor O-SWT. The second node N2 of the driving transistor DRT can be a source node or a drain node, and can be electrically connected to an anode (or a cathode) of the organic light-emitting diode OLED. The third node N3 of the driving transistor DRT can be a drain node or a source node, to which a driving voltage EVDD can be applied. The third node N3 can be electrically connected to a driving voltage line DVL, through which the driving voltage EVDD is supplied.

The storage capacitor Cst can be electrically connected between the first node N1 and the second node N2 of the driving transistor DRT to maintain a data voltage Vdata corresponding to an image signal voltage or a voltage corresponding to the data voltage Vdata during a single frame time (or a predetermined time).

The drain node or source node of the switching transistor O-SWT can be electrically connected to a corresponding data line DL. The source node or drain node of the switching transistor O-SWT can be electrically connected to the first node N1 of the driving transistor DRT. The gate node of the switching transistor O-SWT can be electrically connected to a corresponding gate line GL, through which a scanning signal SCAN is applied thereto.

The scanning signal SCAN can be applied to the gate node of the switching transistor O-SWT via the corresponding gate line, so that the switching transistor O-SWT is on-off controlled.

The switching transistor O-SWT can be turned on by the scanning signal SCAN to transfer the data voltage Vdata, supplied from the corresponding data line DL, to the first node of the driving transistor DRT.

In addition, the storage capacitor Cst can be an external capacitor intentionally designed to be disposed externally of the driving transistor DRT, rather than a parasitic capacitor (e.g., Cgs or Cgd), e.g., an internal capacitor present between the first node N1 and the second node N2 of the driving transistor DRT.

Each of the driving transistor DRT and the switching transistor O-SWT can be an n-type transistor or a p-type transistor.

The subpixel structure illustrated in FIG. 3 has a two transistors and one capacitor (2T1C) structure. However, this is presented for illustrative purposes only, and in some situations, one or more transistors or one or more capacitors can further be included. In addition, the plurality of subpixels can have the same structure, or some subpixels among the plurality of subpixels can have a different structure from that of the remaining subpixels.

Figure 4:
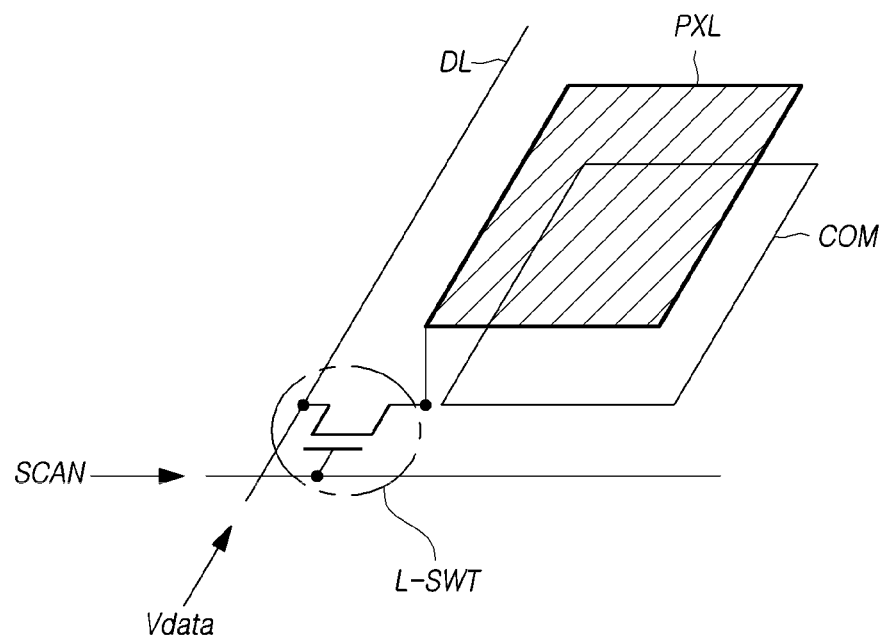
FIG. 4 illustrates a subpixel including a third-type transistor in a situation in which the panel according to embodiments is liquid crystal display (LCD) panel.

FIG. 4 illustrates a structure of a subpixel SP in the panel PNL according to embodiments in a situation in which the panel PNL is an LCD panel.

Referring to FIG. 4, each of the subpixels SP in the LCD panel PNL can include a pixel electrode PXL and a switching transistor L-SWT.

The switching transistor L-SWT can be controlled by a scanning signal SCAN, and can be electrically connected between a corresponding data line DL and the pixel electrode PXL.

The switching transistor L-SWT is turned on by the scanning signal SCAN to transfer a data voltage Vdata, supplied from the data line DL, to the pixel electrode PXL. The pixel electrode PXL, to which the data voltage Vdata is applied, can form an electric field in concert with a common electrode COM, to which a common voltage is applied. That is, a capacitor (e.g., a storage capacitor) can be generated between the pixel electrode PXL and the common electrode COM.

Figure 5:
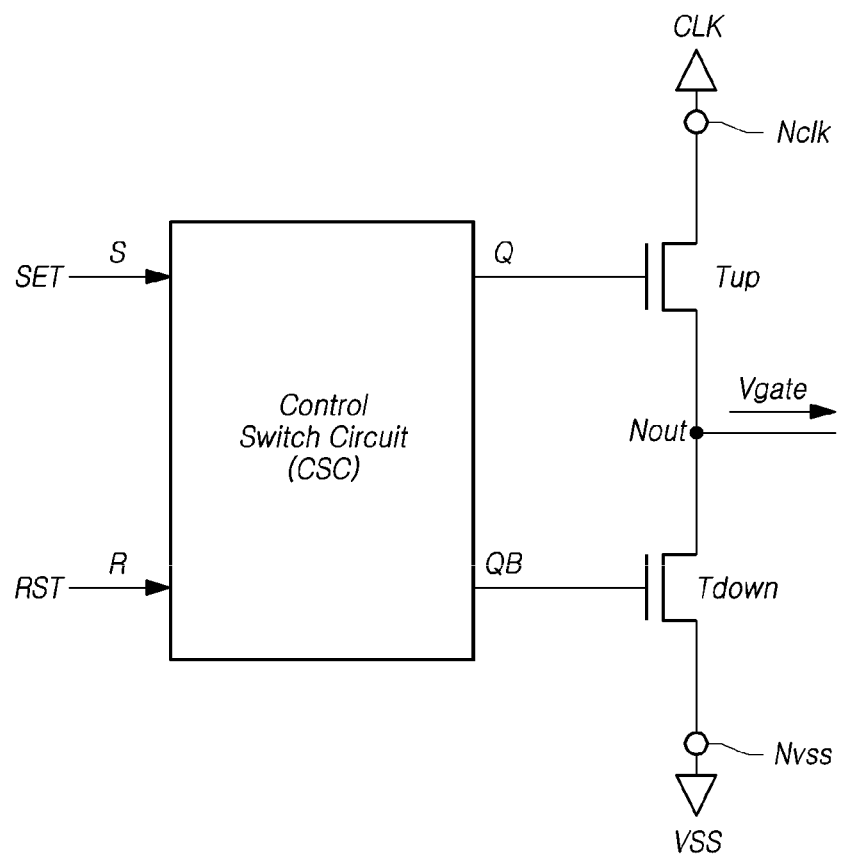
FIG. 5 schematically illustrates a gate driver circuit disposed in the panel according to embodiments.

FIG. 5 schematically illustrates a gate driver circuit GDC disposed in the panel PNL according to embodiments.

Referring to FIG. 5, each of the gate driver circuits GDC can include a pull-up transistor Tup, a pull-down transistor Tdown, a control switch circuit CSC, and the like.

The control switch circuit CSC is a circuit controlling a voltage of a node Q, corresponding to a gate node of the pull-up transistor Tup and a voltage of a node QB corresponding to a gate node of the pull-down transistor Tdown. The control switch circuit CSC can include a plurality of switches (transistors).

The pull-up transistor Tup is a transistor supplying a gate signal Vgate, corresponding to a first level voltage (e.g., a high-level voltage VGH), to the gate line GL through a gate signal output node Nout. The pull-down transistor Tdown is a transistor supplying a gate signal Vgate, corresponding to a second level voltage (e.g., a low-level voltage VGL), to the gate line GL through the gate signal output node Nout. The pull-up transistor Tup and the pull-down transistor Tdown can be turned on at different points in time.

The pull-up transistor Tup is electrically connected between a clock signal application node Nclk, to which a clock signal CLK is applied, and the gate signal output node Nout electrically connected to the gate line GL. The pull-up transistor Tup is turned on or off by the voltage of the node Q.

The gate node of the pull-up transistor Tup is electrically connected to the node Q. A drain node or a source node of the pull-up transistor Tup is electrically connected to the clock signal application node Nclk. The source node or the drain node of the pull-up transistor Tup is electrically connected to the gate signal output node Nout, from which the gate signal Vgate is output.

The pull-up transistor Tup is turned on by the voltage of the node Q to output the gate signal, having a high-voltage level VGH in a high-level range of the clock signal CLK, to the gate signal output node Nout.

The gate signal Vgate of the high-level voltage VGH, output to the gate signal output node Nout, is supplied to the corresponding gate line GL.

The pull-down transistor Tdown is electrically connected between the gate signal output node Nout and a base voltage node Nvss, and is turned on or off by the voltage of the node QB.

The gate node of the pull-down transistor Tdown is electrically connected to the node QB. A drain node or a source node of the pull-down transistor Tdown is electrically connected to the base voltage node Nvss to receive a base voltage VSS, corresponding to a positive voltage, applied thereto. The source node or the drain node of the pull-down transistor Tdown is electrically connected to the gate signal output node Nout, from which the gate signal Vgate is output.

The pull-down transistor Tdown is turned on by the voltage of the node QB to output the gate signal Vgate having a low-level voltage VGL to the gate signal output node Nout. Accordingly, the gate signal Vgate having the low-level voltage VGL can be supplied to the corresponding at line GL through the gate signal output node Nout. Herein, the gate signal Vgate having the low-level voltage VGL can be, for example, a base voltage VSS.

In addition, the control switch circuit CSC can be comprised of two or more transistors, and can include major nodes, such as the node Q, the node QB, a set node (also referred to as a "start node") S, and a reset node R. In some situations, the control switch circuit CSC can further include an input node, to which a variety of voltages, such as a driving voltage VDD, is input.

In the control switch circuit CSC, the node Q is electrically connected to the gate node of the pull-up transistor Tup, and is repeatedly charged and discharged.

In the control switch circuit CSC, the node QB is electrically connected to the gate node of the pull-down transistor Tdown, and is repeatedly charged and discharged.

In the control switch circuit CSC, the set node S has a set signal SET applied thereto, the set signal SET indicating the start of gate driving of the corresponding gate driver circuit GDC.

Herein, the set signal SET applied to the set node S can be a start signal VST input from outside of the gate driver GDR, or can be a signal (e.g., a carry signal), to which a gate signal Vgate, output by a gate driver circuit GDC in a previous stage, preceding the current gate driver circuit GDC, is feedbacked.

The reset signal RST, applied to the reset node R of the control switch circuit CSC, can be a reset signal, by which the gate driver circuits GDC of all stages are simultaneously initialized, or can be a carry signal input from another stage (e.g., a previous or subsequent stage).

The control switch circuit CSC charges the node Q in response to the set signal SET, and discharges the node Q in response to the reset signal RST. The control switch circuit CSC can include an inverter circuit to charge or discharge the node Q and the node QB at different points in time.

As illustrated in FIG. 3, the driving transistor DRT and the switching transistor O-SWT can be disposed in each subpixel SP among the plurality of subpixels SP in the active area A/A of the panel PNL implemented as an OLED panel.

In addition, as illustrated in FIG. 4, a switching transistor L-SWT can be disposed in each subpixel SP among the plurality of subpixels SP in the active area A/A of the OLED panel PNL.

As described above, at least one of the transistor DRT, O-SWT, or L-SWT can be disposed in each area of the plurality of subpixels SP in the active area A/A of the OLED panel PNL.

In addition, as illustrated in FIG. 2, the gate driver circuit GDC can be implemented using an INS1P structure, e.g., the gate driver circuit GDC can be disposed within the panel PNL. In this situation, a variety of transistors of the gate driver circuit GDC, such as the pull-up transistor Tup, the pull-down transistor Tdown, and other transistors within the CSC, as illustrated in FIG. 5, can be disposed in the non-active area N/A, located in the periphery of the active area A/A of the panel PNL.

In addition, in the transistors TR disposed in the active area A/A and/or the non-active area N/A of the panel PNL, the device performance (e.g., mobility or on-off performance) thereof can be determined by the channel length. Therefore, the structure of a transistor TR, among the transistors TR, having a short channel to improve device performance, will be described hereinafter.

In addition, descriptions will be provided to the structure of a transistor TR including an active layer having a short channel, in which the transistor TR can be fabricated by a simple process, and the channel area of the active layer can be protected from damage.

The transistor TR able to provide the short channel, according to embodiments, can include: a gate electrode disposed on a substrate; a first insulating film disposed to cover the gate electrode; and an active layer disposed on the first insulating film. The active layer may include: a first portion overlapping a top surface of the gate electrode; a second portion extending from the first portion, located on a side surface of the gate electrode, and including the channel area; and a third portion extending from the second portion and located on a portion of the first insulating film, on which the gate electrode is not disposed. The transistor TR can also include a second insulating film disposed on the active layer; a first electrode disposed on the second insulating film and electrically connected to the first portion of the active layer; and a second electrode disposed on the second insulating film and electrically connected to the third portion of the active layer. The side surface of the gate electrode can have a reverse tapered shape or one or more stepped portions on an area corresponding to the second portion of the active layer.

A structure of the transistor TR, as briefly described above, will be described in more detail with reference to the accompanying drawings.

Figure 6:
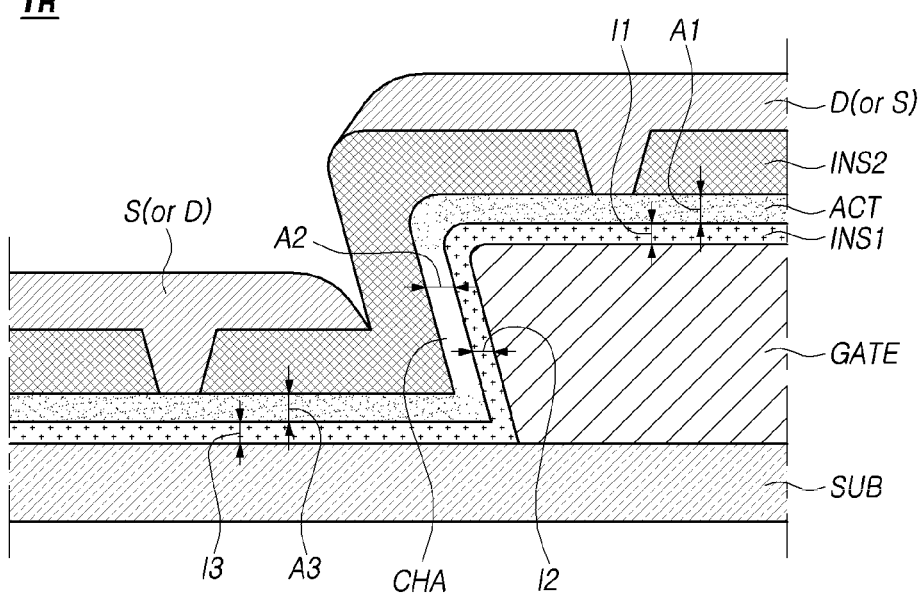
FIG. 6 illustrates a transistor having a vertical structure according to an embodiment.

FIG. 6 illustrates a transistor having a vertical structure according to an embodiment.

The transistor TR having a vertical structure according to embodiments is a transistor TR in which a channel area CHA of an active layer ACT is disposed to be non-parallel to a substrate SUB. Collectively, all situations in which the angle between the channel area CHA and the substrate SUB of the active layer ACT is greater than 0° and smaller than 180° can be taken.

Referring to FIG. 6, the transistor TR having a vertical structure, disposed in the panel PNL, can include a gate electrode GATE, an active layer ACT, a source electrode S, and drain electrode D.

Specifically, the gate electrode GATE is disposed on the substrate SUB. The gate electrode GATE can serve as a spacer of the transistor TR according to the present embodiment.

The spacer is a structure, by which the channel area of the active layer extends vertically, in a direction non-parallel to the substrate SUB in the transistor TR having a vertical structure.

According to an embodiment, the gate electrode GATE serves to extend the channel area of the active layer ACT vertically, in a direction non-parallel to the substrate SUB while also serving as the gate electrode. In other words, the gate electrode GATE has dual purposes, e.g., activing the channel to turn on and off the transistor and also lengthening the channel, since the channel is disposed along a side of the gate electrode GATE. Accordingly, no separate spacers are required, thereby simplifying the process.

According to an embodiment, the gate electrode GATE can be provided as a single layer. For example, as illustrated in FIG. 6, the width of the gate electrode GATE can include an area that widens in a direction perpendicularly away from the substrate SUB. For example, the gate electrode GATE can have a reverse tapered shape relative to the substrate. Herein, the width of the gate electrode GATE can be a length taken in a horizontal direction.

A first insulating film INS1 is disposed to cover the gate electrode GATE. That is, the first insulating film INS1 can be disposed on the top surface and a side surface of the gate electrode GATE and on a portion of the substrate SUB, on which the gate electrode GATE is not disposed.

The active layer ACT is disposed on the first insulating film INS1. Specifically, the active layer ACT can be disposed on an area corresponding to a portion or the entirety of the top surface of the gate electrode GATE, on an area corresponding to at least one side surface of the gate electrode GATE, and on a portion of the substrate SUB on which the gate electrode GATE is not disposed.

According to another aspect, the active layer ACT is disposed on the first insulating film INS1. In particular, the active layer ACT can include: a first portion overlapping the top surface of the gate electrode GATE; a second portion extending from the first portion to be located on a side surface of the gate electrode GATE, and including the channel area CHA; and a remaining portion extending from the second portion to be located on a portion of the first insulating film INS1, on which the gate electrode GATE is not disposed.

Although the active layer ACT is illustrated as being a single layer in FIG. 6, the present disclosure is not limited thereto. Rather, the active layer ACT can be comprised of two or more layers.

A second insulating film INS2 is disposed on the active layer ACT and the first insulating layer INS1 while covering the active layer ACT.

The thickness of the second insulating film INS2 can be thicker than the first insulating layer INS1.

A first electrode and a second electrode can be disposed on the second insulating film INS2, spaced apart from each other. Here, one of the first electrode and the second electrode can be a source electrode S, while the other of the first electrode and the second electrode can be a drain electrode D.

Hereinafter, descriptions will be mainly focused on a configuration in which the first electrode is the drain electrode D and the second electrode is the source electrode S.

The source electrode S can overlap one end (or a first portion) of the active layer ACT, while the drain electrode D can overlap the other end (or a third portion) of the active layer ACT. Here, one of the source electrode S or the drain electrode D may overlap the gate electrode GATE.

In other words, the top surface of the gate electrode GATE can overlap the active layer ACT and overlap one of the source electrode S or the drain electrode D.

According to an embodiment, the first insulating film INS1 can be a gate insulating film.

The first insulating film INS1 can be disposed on the entirety of the active area A/A of the panel PNL. In some situations, the first insulating film INS1 can extend to be disposed on the non-active area N/A located in the periphery of the active area A/A.

The first insulating film INS1 can be a thin insulator layer fabricated by front side deposition. That is, the first insulating film INS1 can be a thin film fabricated by front side deposition without the use of a mask.

In addition, the active layer ACT can be disposed on a portion of the active area A/A by mask processing, and can be disposed on a portion of the non-active area N/A. The active layer ACT can be a thin film.

In the electronic device according to embodiments, the first insulating film INS1 and the active layer ACT can be fabricated by a thin-film deposition method, such as metal-organic chemical vapor deposition (MOCVD) or atomic layer deposition (ALD), in which thin-film deposition processing is controllable.

The MOCVD method is a subclass of chemical vapor deposition (CVD), used to fabricate a thin film by a deposition reaction on the surface of a hot substrate onto which reactant gases are injected. The reactant gases contain an organometallic complex. The MOCVD method is a technique of growing a semiconductor thin film by decomposing organometallic gases on the hot substrate by heat. The MOCVD method is performed at a lower temperature than other CVD methods, such as plasma enhanced chemical vapor deposition (PECVD) and low-pressure chemical vapor deposition (LPCVD). Thin film processing can be controlled at the atomic level, so that a uniform thin film can be fabricated.

The ALD method is a subclass of CVD, used to fabricate a thin film by separately supplying reactants and depositing particles, produced by chemical reaction of reactant gases, on the surface of a substrate. After chemical adsorption of one reactant to the substrate, a second gas or a third gas is supplied to the substrate, causing subsequent chemical adsorption to the substrate, so that a thin film is deposited on the substrate.

The use of the MOCVD or ALD method can improve the productivity or growth rate of a thin film, compared physical vapor deposition (PVD) methods or other CVD methods. In addition, due to high thin film coating performance, the thickness of the thin film may be precisely adjusted. That is, the use of the MOCVD or ALD method can fabricate a thin film having excellent step-coverage properties.

In addition, the MOCVD or ALD method can fabricate a thin film having a higher thickness and composition uniformity, as well as a higher level of density, compared to other deposition methods, such as sputtering.

The first insulating film INS1 and the active layer ACT, fabricated by the MOCVD or ALD method, can be very thin films fabricated without a break, e.g., no discontinuity in an electrical circuit, even in a stepped area. In other words, the first insulating film INS1 and the active layer ACT can be laid down as continuous unbroken layers or strips.

In addition, the first insulating film INS1 and the active layer ACT, fabricated by the MOCVD or ALD method, can have a very small position-specific variation in thickness. That is, the first insulating film INS1 and the active layer ACT can have very high thickness uniformity.

Specifically, a first thickness I1 of the first insulating film INS1 disposed in an area corresponding to the top surface of the gate electrode GATE, a second thickness I2 of the first insulating film INS1 disposed in an area corresponding to a side surface of the gate electrode GATE, and a third thickness I3 of the first insulating film INS1 disposed on the substrate SUB, on which the gate electrode GATE is not disposed, can have corresponding thicknesses, respectively. For example, the first, second and third thicknesses (I1, I2, I3) of the first insulating film INS1 can be equal or have approximately the same thickness.

In addition, a first thickness A1 of the active layer ACT disposed in an area corresponding to the top surface of the gate electrode GATE, a second thickness A2 of the active layer ACT disposed in an area corresponding to the side surface of the gate electrode GATE, and a third thickness A3 of the active layer ACT disposed on the substrate SUB, on which the gate electrode GATE is not disposed, may have corresponding thicknesses, respectively. For example, the first, second and third thicknesses (A1, A2, A3) of the active layer ACT can be equal or have approximately the same thickness.

In addition, as illustrated in FIG. 6, even in the situation that the first insulating film INS1 and the active layer ACT are disposed on the gate electrode GATE, in which the side surface of the gate electrode GATE has a reverse tapered shape, the first insulating film INS1 and the active layer ACT can be provided with a uniform thickness without any breaks, e.g., no discontinuity in an electrical circuit.

According to an embodiment, the thickness of the first insulating film INS1 can range from 50 nm to 200 nm, and the thickness of the active layer ACT can range from 10 nm to 50 nm. However, embodiments are not limited thereto.

In addition, the first insulating film INS1 and the active layer ACT, fabricated by the MOCVD or ALD method, can be high-density thin-films.

In the electronic device according to embodiments, the second insulating film INS2 can be disposed on the entirety of the active area A/A of the panel PNL. In some situations, the second insulating film INS2 can extend to be disposed on the non-active area N/A located in the periphery of the active area A/A.

The second insulating film INS2 can be fabricated by a thin-film deposition method, such as MOCVD or ALD, designed to fabricate the first insulating film INS1 or the active layer ACT, or by a typical CVD or PVD method, except for the thin-film deposition method, such as MOCVD or ALD.

In the electronic device according to embodiments, the first insulating film INS1 can be fabricated to be thicker than the second insulating film INS2 even in the situation that the first insulating film INS1 is fabricated by the thin-film deposition method, such as MOCVD or ALD, designed to fabricate the second insulating film INS2. However, embodiments are not limited thereto.

However, when the second insulating film INS2 is fabricated by a typical CVD or PVD method, except for the thin-film deposition method, such as MOCVD or ALD, the second insulating film INS2 can have a greater thickness variation and lower film density than the first insulating film INS1 (e.g., the first insulating film INS1 can be denser than the second insulating film INS2 and also have a more uniform thickness).

In addition, the first insulating film INS1 can contain at least one selected from among, for example, SiOx, SiO$_2$, TiOx, SiON, or SiNx.

In addition, the second insulating film INS2 can contain at least one selected from among, for example, SiOx, SiO$_2$, TiOx, SiON, or SiNx.

The first insulating film INS1 and the second insulating film INS2 can be made of the same material. In an example, both the first insulating film INS1 and the second insulating film INS2 can be made of SiO$_2$. In another example, both the first insulating film INS1 and the second insulating film INS2 can be made of SiOx.

The first insulating film INS1 and the second insulating film INS2 can be made of different materials. For example, the first insulating film INS1 may be made of SiO$_2$, while the second insulating film INS2 can be made of SiNx.

In addition, the active layer ACT of the transistor TR having a vertical structure according to embodiments can be selected from among a variety of types.

In an example, the active layer ACT can be made of an amorphous silicon (a-Si) semiconductor.

In another example, the active layer ACT can be made of an oxide semiconductor. The transistor TR including this active layer ACT is referred to as an oxide transistor. In this situation, for example, the oxide semiconductor may be an n-type oxide semiconductor, such as indium gallium zinc oxide (IGZO), indium zinc oxide (IZO), or indium titanium zinc oxide (ITZO), or can be a p-type oxide semiconductor, such as CuOx, SnOx, or NiOx.

Since the active layer ACT is made of an amorphous semiconductor or an oxide semiconductor, the electronic device according to embodiments can be easily designed to have a large area.

The active layer ACT includes the channel area CHA. The channel area CHA can be provided in an area corresponding to the entirety or a portion of a side surface of the gate electrode GATE.

In other words, the length of the channel area CHA can be the same as or shorter than the height of the gate electrode GATE. Although the height of the gate electrode GATE according to an embodiment can range from 100 nm to 500 nm, the height of the gate electrode GATE is not limited thereto.

That is, the length of the channel area CHA of the active layer ACT according to embodiments can be adjusted by the height of the gate electrode GATE.

As described above, the transistor TR having a vertical structure according to an embodiment is disposed in an area in which the channel area CHA of the active layer ACT corresponds to the portion or the entire side surface of the gate electrode GATE, such that the active layer ACT having a short channel can advantageously be realized.

Accordingly, electrical properties of the transistor TR having a vertical structure can be improved.

In particular, even in the situation that the active layer ACT according to an embodiment is fabricated to be thin using the ADL method, superior electrical characteristics thereof can be maintained, due the short channel of the active layer ACT.

An area of the active layer ACT, except for the channel area CHA, can have higher conductivity than the channel area CHA. For example, the area of the active layer ACT, except for the channel area CHA, can be an area processed to be conductive or a doped area.

The source electrode S and the drain electrode D can contact areas of the active layer ACT, the conductivity of which is higher than the conductivity of the channel area CHA of the active layer ACT, via holes provided in the second insulating film INS2. The area of the active layer ACT contacting the source electrode S can be a source area, while the area of the active layer ACT contacting the drain electrode D can be a drain area.

Since the source electrode S and the drain electrode D contact the active layer ACT only via the holes provided in the second insulating film INS2, the contact resistance between the source/drain electrode S/D and the active layer ACT can be reduced.

In addition, since the source area and the drain area of the active layer ACT are areas processed to be conductive or doped areas, the contact resistance between the source electrode S and the source area and the contact resistance between drain electrode D and the drain area can be lowered, compared to the situation in which none of the source area and the drain area are processed to be conductive or doped.

The source electrode S and the drain electrode D do not overlap each other. Thus, parasitic capacitance is not be generated between the source electrode S and the drain electrode D or is at least substantially reduced.

Since a typical transistor having a vertical structure is configured such that the source electrode and the drain electrode, e.g., metal electrodes, overlap each other, parasitic capacitance may be generated between the source electrode and the drain electrode, which is problematic.

In contrast, the transistor TR having a vertical structure according to an embodiment has a structure for reducing unnecessary parasitic capacitance, since the source electrode S and the drain electrode D do not overlap each other as described above.

In addition, as described above, in the transistor TR having a vertical structure according to an embodiment, since the active layer ACT has the short channel area CHA, excellent electrical properties are obtained.

In the electronic device according to an embodiment, an insulation pattern IP can be disposed between the active layer ACT and the second insulating film INS2, in the area corresponding to at least one side surface of the gate electrode GATE.

This structure will be described hereinafter with reference to FIGS. 7 and 8.

Figure 7:
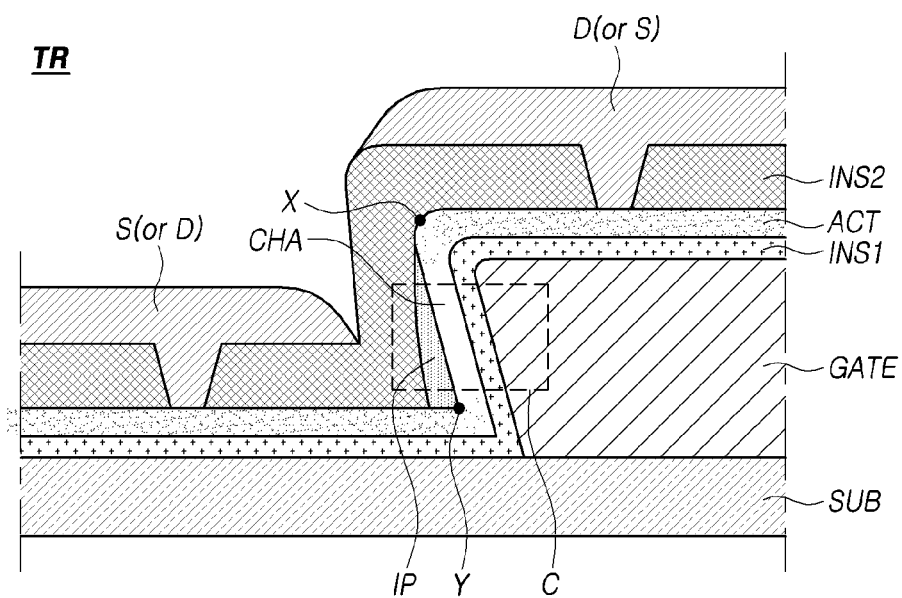
FIG. 7 is a cross-sectional view illustrating the insulation pattern disposed between the active layer and the second insulating film, in an area corresponding to one side surface of the gate electrode illustrated in FIG. 6 according to an embodiment.

FIG. 7 is a cross-sectional view illustrating the insulation pattern being disposed between the active layer and the second insulating film, in an area corresponding to one side surface of the gate electrode illustrated in FIG. 6. FIG. 8 is an enlarged view of area C in FIG. 7.

Referring to FIG. 7, in the area corresponding to the channel area CHA, at least one side surface of the gate electrode GATE can have a reverse tapered shape relative to the substrate.

The first insulating film INS1 is disposed to cover the gate electrode GATE. Since the first insulating film INS1 is fabricated by the MOCVD or ALD method, the first insulating film INS1 can be provided to conform to the surface shape of the substrate SUB including the gate electrode GATE, with a uniform thickness for each position.

Since the active layer ACT, overlapping portions of the gate electrode GATE and the first insulating film INS1, is also fabricated by the MOCVD or ALD method, the active layer ACT can be provided to conform to the surface shape of the substrate SUB including the gate electrode GATE, with a uniform thickness for each position.

Figure 8:
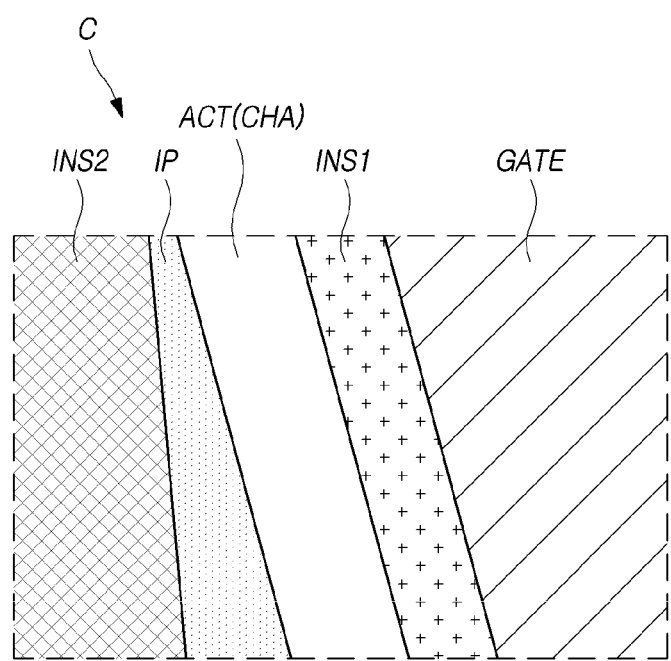
FIG. 8 is an enlarged view of area B in FIG. 7 according to an embodiment.

As illustrated in FIGS. 7 and 8, the second insulating film INS2 is disposed on the active layer ACT.

The insulation pattern IP is disposed between the active layer ACT and the second insulating film INS2, in the area corresponding to at least one side surface of the gate electrode GATE.

The insulation pattern IP can be disposed to have a shape corresponding to the channel area CHA of the active layer ACT (e.g., the insulation pattern IP overlaps with the channel area CHA or is disposed along the channel area CHA).

In addition, the insulation pattern IP can be disposed to correspond to a portion of the area having higher conductivity than the channel area CHA while being disposed to correspond to the channel area CHA.

That is, the width IPW of the insulation pattern IP may be wider than the width CHAW of the channel area CHA. Herein, the width IPW of the insulation pattern IP and the width CHAW of the channel area CHA mean maximum lengths of the insulation pattern IP and the channel area CHA, respectively, taken in a direction perpendicular to the substrate SUB.

The insulation pattern IP can serve to protect the channel area CHA of the active layer ACT from damage during the process of fabricating an electronic device. The insulation pattern IP can also be referred to as an etch stop.

Although the gate electrode GATE is illustrated as a single layer in FIGS. 6 to 8, the present disclosure is not limited thereto. For example, as illustrated in FIGS. 9 to 11, the gate electrode GATE can have a double-layer structure, or triple-layer structure as illustrated in FIGS. 12-15.

Figure 9:
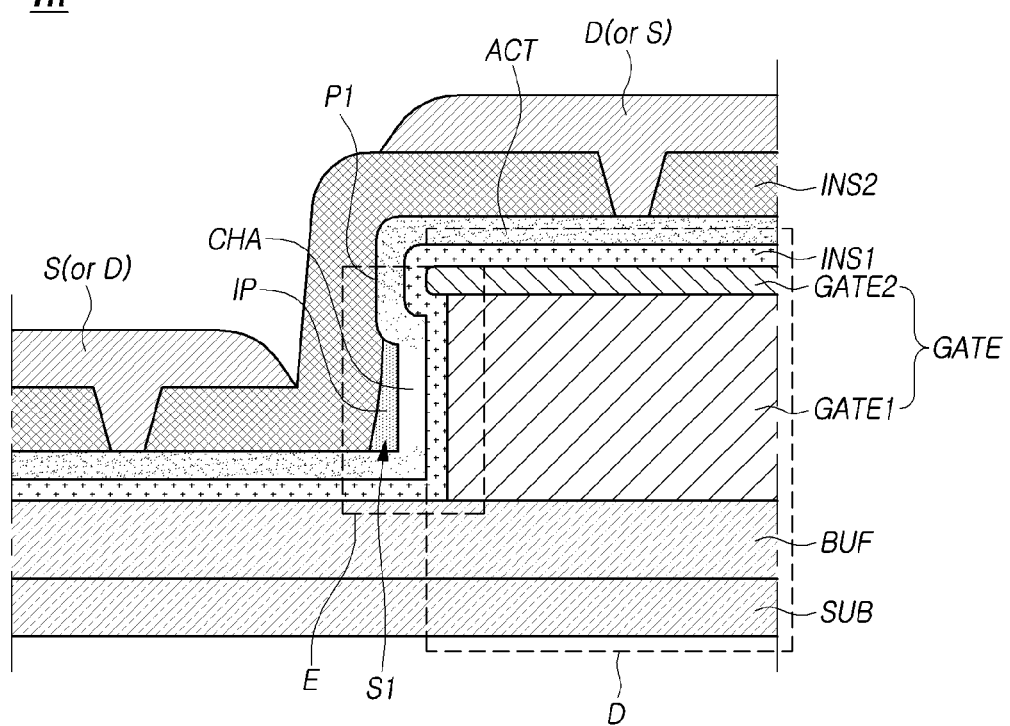
FIG. 9 is a cross-sectional view illustrating an electronic device according to another embodiment.
Figure 10:
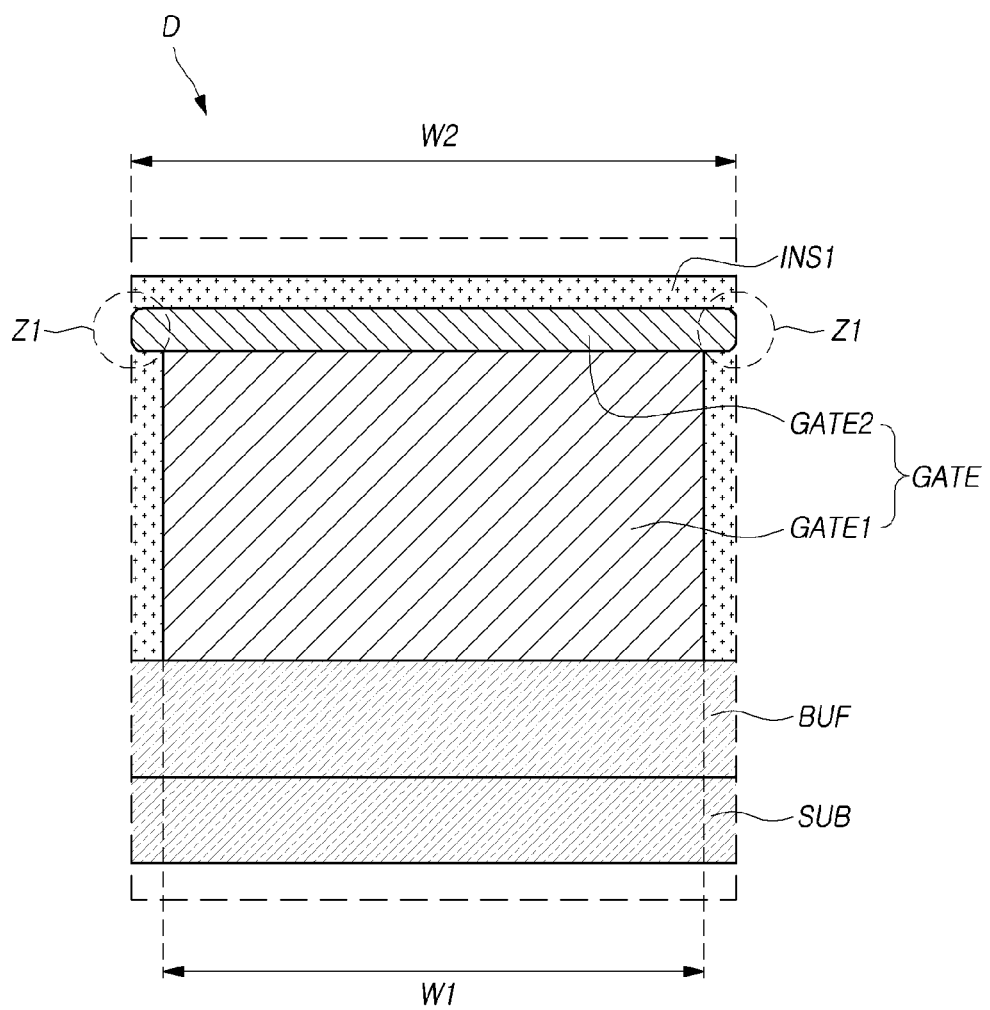
FIG. 10 is an enlarged view of area D in FIG. 9 according to an embodiment.
Figure 11:
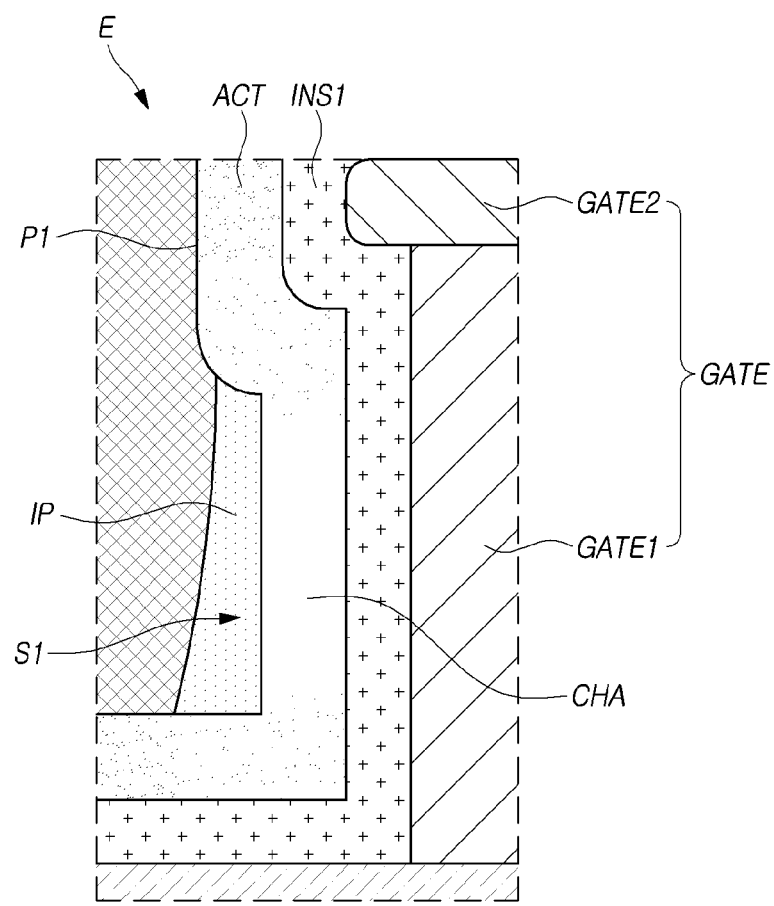
FIG. 11 is an enlarged view of area E in FIG. 9 according to an embodiment.

FIG. 9 is a cross-sectional view illustrating an electronic device according to another embodiment, FIG. 10 is an enlarged view of area D in FIG. 9, and FIG. 11 is an enlarged view of area E in FIG. 9.

In the following, descriptions of some features (e.g., components or effects) will be omitted when they are identical to those of the above-described embodiments.

Referring to FIG. 9, the gate electrode GATE of the electronic device according to another embodiment includes a first gate electrode GATE1 and a second gate electrode GATE2 disposed on the first gate electrode GATE1. That is, the gate electrode GATE can have a double-layer structure comprised of two layers.

Specifically, a buffer layer BUF is disposed on the substrate SUB. The first gate electrode GATE1 is disposed on the buffer layer BUF. The second gate electrode GATE2 is disposed on the first gate electrode GATE1.

The gate electrode GATE having the double-layer structure can include at least one stepped portion on or over at least one side surface.

Specifically, as illustrated in FIG. 10, the width W1 of the first gate electrode GATE1 can be narrower than the width W2 of the second gate electrode GATE2. Here, the width W1 of the first gate electrode GATE1 and the width W2 of the second gate electrode GATE2 can be defined as maximum lengths of the first gate electrode GATE1 and the second gate electrode GATE2, taken in a direction parallel to the substrate SUB.

Accordingly, the second gate electrode GATE2 can have protrusions Z1, e.g., portions protruding beyond the first gate electrode GATE1 in the direction parallel to the substrate SUB.

According to an embodiment, the gate electrode GATE can have at least one stepped portion on at least one side surface, defined by the protruding portion.

The material of the first gate electrode GATE1 and the material of the second gate electrode GATE2 can be different. For example, the material of the first gate electrode GATE1 and the material of the second gate electrode GATE2 can have different wet etching rates. Specifically, the first gate electrode GATE1 can be etched at a faster rate than the second gate electrode GATE2 in the same etching solution (e.g., in order to create the overhang protrusions).

For example, the material of the first gate electrode GATE1 can be molybdenum (Mo) or a Mo alloy, e.g., a material containing Mo and at least one metal selected from among, but not limited to, aluminum (Al), silver (Ag), platinum (Pt), or titanium (Ti). The material of the second gate electrode GATE2 can be copper (Cu) or a Cu alloy, e.g., a material containing Cu and at least one metal selected from among, but not limited to, aluminum (Al), silver (Ag), platinum (Pt), or titanium (Ti). According to an embodiment, the material of the first gate electrode GATE1 and the material of the second gate electrode GATE2 are not limited thereto. Any other materials can be used as long as the material of the first gate electrode GATE1 and the material of the second gate electrode GATE2 are conductive materials and the material of the first gate electrode GATE1 has a faster etching rate than the material of the second gate electrode GATE2 in the same etching solution.

As illustrated in FIG. 9, the first insulating film INS1 is disposed to cover the gate electrode GATE comprised of the first and second gate electrodes GATE1 and GATE2. The active layer ACT is disposed on the first insulating film INS1.

Since each of the first insulating film INS1 and the active layer ACT is fabricated by the MOCVD or ALD method, the first insulating film INS1 and the active layer ACT can be provided along the surface of the components disposed below the first insulating film INS1 and the active layer ACT, with a uniform thickness.

Accordingly, each of the first insulating film INS1 and the active layer ACT can have portions protruding in a direction parallel to the substrate SUB, in areas corresponding to the areas in which the protrusions Z1 of the gate electrode GATE are present. In other words, an area having a stepped portion is presented on at least one side surface of each of the first insulating film INS1 and the active layer ACT, due to the side surface shape of the gate electrode GATE.

In addition, the channel area CHA of the active layer ACT can be provided in an area corresponding to a side surface of the first gate electrode GATE1.

In addition, the channel area CHA can extend from the area corresponding to the side surface of the first gate electrode GATE1 to an area corresponding to a portion of a side surface of the second gate electrode GATE2.

That is, the channel area CHA of the active layer ACT can be provided in an area corresponding to a portion of the side surface of the gate electrode GATE. That is, the active layer ACT can have the short channel area CHA lower than the height of the gate electrode GATE.

The second insulating film INS2 is disposed on the active layer ACT and the first insulating film INS1.

The insulation pattern IP is disposed between the active layer ACT and the second insulating film INS2, in the area corresponding to at least one side surface of the gate electrode GATE.

As illustrated in FIGS. 9 and 11, a space S1 in which the material of the active layer ACT is not disposed is present between an area of the active layer ACT, contacting the source electrode S and having higher conductivity than the channel area CHA, and an area of the active layer ACT, contacting the drain electrode D and having higher conductivity than the channel area CHA.

As described above, the active layer ACT is disposed to conform to the surface shape of the components disposed below the active layer ACT. Accordingly, the active layer ACT has a protruding portion P1 (e.g., an overhang portion or eave) in each of areas corresponding to the protruding portions of the first insulating film INS1, defined by the side surface shape of the gate electrode GATE (see FIGS. 9 and 11).

Since the active layer ACT includes the protruding portion P1, at least one stepped portion can be provided on the area corresponding to at least one side surface of the gate electrode GATE.

The space S1 can be defined on the side surface of the active layer ACT, due to the stepped shape of the active layer ACT, and the insulation pattern IP can be disposed in the space S1.

The space S1 can overlap the channel area CHA of the active layer ACT. That is, the insulation pattern IP can be disposed to overlap the channel area CHA. The width IPW of the insulation pattern IP can be wider than the width CHAW of the channel area CHA.

The insulation pattern IP can be made of an inorganic insulating material containing at least one selected from among, but not limited to, SiOx, SiO$_2$, TiOx, SiON, or SiNx.

The insulation pattern IP can serve to protect the channel area CHA from damage.

Although the gate electrode GATE is illustrated as having the double-layer structure in FIGS. 9 to 11, embodiments are not limited thereto. For example, as illustrated in FIGS. 12 to 14, the gate electrode GATE can have a triple-layer structure comprised of three layers.

Figure 12:
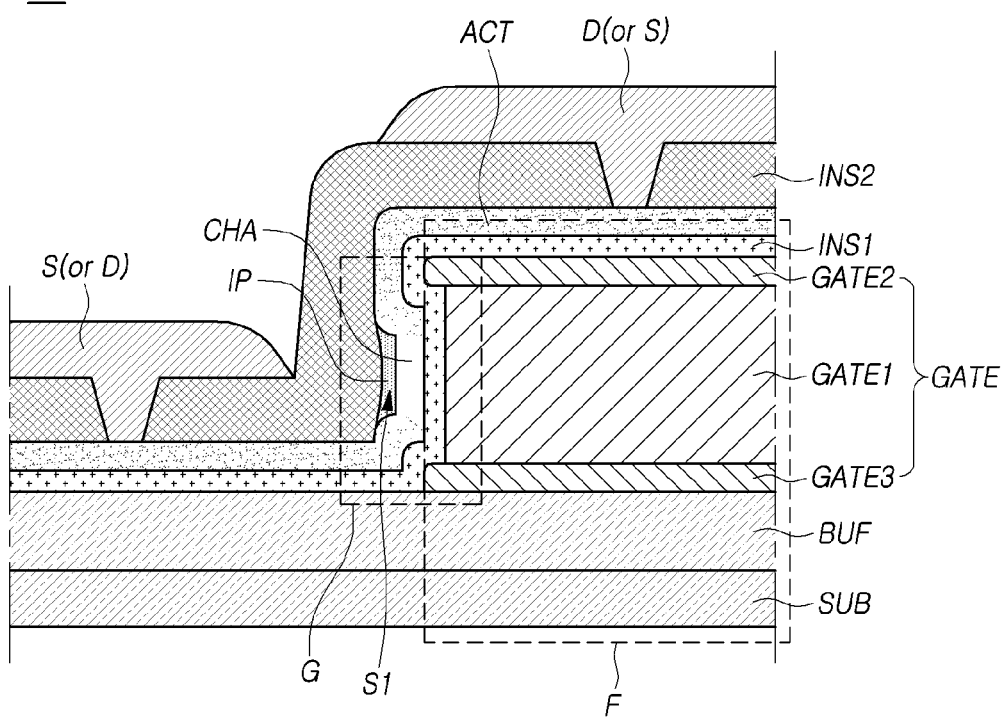
FIG. 12 is a cross-sectional view illustrating an electronic device according to another embodiment.
Figure 13:
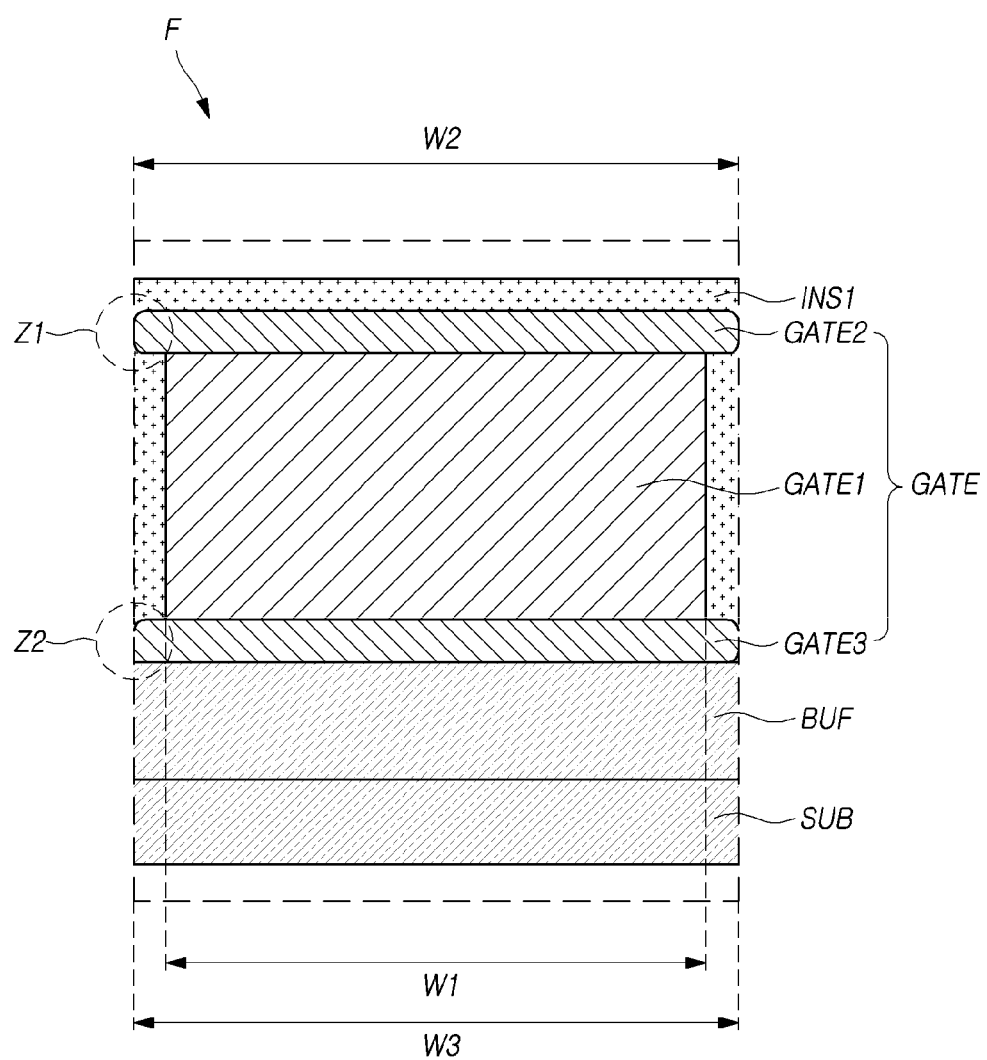
FIG. 13 is an enlarged view of area F in FIG. 12 according to an embodiment.
Figure 14:
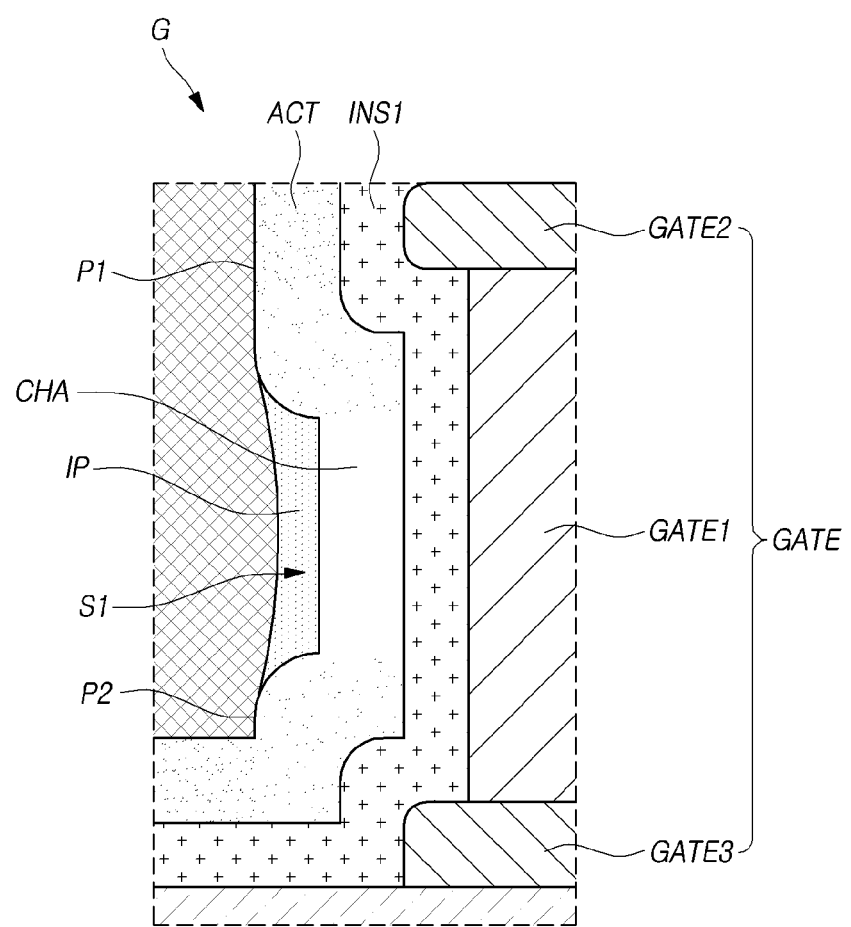
FIG. 14 is an enlarged view of area G in FIG. 12 according to an embodiment.

FIG. 12 is a cross-sectional view illustrating an electronic device according to another embodiment, FIG. 13 is an enlarged view of area F in FIG. 12, and FIG. 14 is an enlarged view of area G in FIG. 12.

In the following, descriptions of some features (e.g., components or effects) will be omitted when they are identical to those of the above-described embodiments.

Referring to FIG. 12, in the gate electrode GATE according to another embodiment, the gate electrode GATE further includes a third gate electrode GATE3 disposed below the first gate electrode GATE1 illustrated in FIG. 9.

Specifically, the buffer layer BUF is disposed on the substrate SUB. The third gate electrode GATE3 is disposed on the buffer layer BUF. The first gate electrode GATE1 is disposed on the third gate electrode GATE3. The second gate electrode GATE2 is disposed on the first gate electrode GATE1.

The gate electrode GATE having the triple-layer structure comprised of three layers can be provided with two stepped portions on at least one side surface.

Specifically, as illustrated in FIG. 13, the width W1 of the first gate electrode GATE1 may be narrower than either the width W2 of the second gate electrode GATE2 or the width W3 of the third gate electrode GATE3.

According to an embodiment, the width W1 of the second gate electrode GATE2 and the width W3 of the third gate electrode GATE3 can correspond (or be equal) to each other, but embodiments are not limited thereto.

The material of the first gate electrode GATE1 can differ from the material of either the second gate electrode GATE2 or the third gate electrode GATE3. For example, the wet etching rate of the material of the first gate electrode GATE1 can differ from the wet etching rate of either the material of the second gate electrode GATE2 or the material of the third gate electrode GATE3. Specifically, the material of either the second gate electrode GATE2 or the third gate electrode GATE3 can be etched at a slower rate than the material of the first gate electrode GATE1 in the same etching solution.

Although the material of the second gate electrode GATE2 and the material of the third gate electrode GATE3 can be the same, embodiments are not limited thereto. Any other materials can be used as long as each material of the second gate electrode GATE2 and the third gate electrode GATE3 is etched at a slower rate than the material of the first gate electrode GATE1.

Since the width of the second gate electrode GATE2 is wider than the width of the first gate electrode GATE1, the second gate electrode GATE2 has protrusions Z1, e.g., portions protruding beyond the first gate electrode GATE1 in a transverse direction of the gate electrode GATE.

In addition, since the width of the third gate electrode GATE3 is wider than the width of the first gate electrode GATE1, the third gate electrode GATE3 has protrusions Z2, e.g., portions protruding beyond the first gate electrode GATE1 in a transverse direction of the gate electrode GATE.

The gate electrode GATE may have two stepped portions on at least one side surface, due to the protrusions Z1 and Z2 (e.g., the inner corners between the eaves/protrusions and the side surface of the first gate electrode GATE1).

The first insulating film INS1 is disposed to cover the gate electrode GATE comprised of the first to third gate electrodes GATE1, GATE2, and GATE3. The active layer ACT is disposed on the first insulating film INS1.

Each of the first insulating film INS1 and the active layer ACT can have portions protruding in a direction parallel to the substrate SUB, in areas corresponding to the areas in which the protrusions Z1 of the second gate electrode GATE2 are present and the areas in which the protrusions Z2 of the third gate electrode GATE3 are present.

In other words, each of the first insulating film INS1 and the active layer ACT can have two stepped portions on at least one side surface thereof, due to the side surface shape of the gate electrode GATE (e.g., the protrusions and the stepped portions can form a type of concave pocket at the side of the gate electrode GATE).

In addition, the channel area CHA of the active layer ACT can be provided in an area corresponding to the side surface of the first gate electrode GATE1.

In addition, the channel area CHA can extend from the area corresponding to the side surface of the first gate electrode GATE1 to areas corresponding to a portion of a side surface of the second gate electrode GATE2 and a portion of a side surface of the third gate electrode GATE3. That is, the active layer ACT can have the short channel area CHA lower than the height of the gate electrode GATE.

The second insulating film INS2 is disposed on the active layer ACT and the first insulating film INS1.

The insulation pattern IP is disposed between the active layer ACT and the second insulating film INS2, in the area corresponding to at least one side surface of the gate electrode GATE.

In addition, as illustrated in FIG. 14, the active layer ACT includes a protruding portion P1 and a protruding portion P2 defined by the side surface shape of the gate electrode GATE. The protruding portion P1 can be located in each of areas corresponding to the areas in which the protrusions Z1 of the second gate electrode GATE2 are provided, while the protruding portion P2 can be located in each of the areas corresponding to the areas in which the protrusions Z2 of the third gate electrode GATE3 are provided.

That is, due to the stepped portions present on the side surface of the gate electrode GATE, the active layer ACT can also be provided with stepped portions at positions corresponding to the stepped portions of the gate electrode GATE (e.g., since the active layer ACT can be disposed on the gate electrode GATE in a manner in which the active layer ACT follows the contours of the gate electrode GATE).

The insulation pattern IP can be located to overlap the areas between the protruding portions P1 and P2 of the active layer ACT (e.g., insulation pattern IP can be disposed in a type of pocket between the protruding portions P1 and P2). In addition, the insulation pattern IP can overlap portions of the protruding portions P1 and P2 of the active layer ACT while overlapping the areas between the protruding portions P1 and P2 of the active layer ACT.

The width IPW of the insulation pattern IP can be wider than the width CHAW of the channel area CHA. That is, the insulation pattern IP can overlap the channel area CHA of the active layer ACT to protect the channel area CHA.

The transistors TR illustrated in FIG. 6, 9, or 12 have a structure by which the gate electrode GATE serving as a spacer in FIG. 6, the active layer ACT, the source electrode S, and the drain electrode D are stacked on one another in a vertical direction.

Such transistors TR can reduce device areas, compared to transistors having a horizontal structure. Specifically, the transistor TR according to embodiments is configured such that a portion of the active layer ACT extends vertically, in a direction non-parallel to the substrate SUB, due to the gate electrode GATE. Accordingly, the channel area CHA, as well as the length of the active layer ACT, can be reduced, thereby reducing the area of the device.

In addition, the active layer ACT is configured to directly contact the source electrode S and the drain electrode D. When an insulating film is disposed between the active layer ACT and the source electrode S and between the active layer ACT and the drain electrode D, the source electrode S and the drain electrode D can respectively contact the active layer ACT via contact holes formed in the insulating film. In this situation, the area of the source electrode S and the area of the drain electrode D may inevitably be increased by areas corresponding to the widths of entrances of the contact holes formed in the insulating film. In contrast, as described above, the transistor TR according to an embodiment can reduce the area of the device, due to the structure by which the active layer ACT is in direct contact with the source electrode S and the drain electrode D.

That is, the transistor TR according to embodiments can have a reduced area while also obtaining superior electrical properties.

The switching transistor O-SWT in each of the subpixels SP in the active area A/A of the OLED panel PNL illustrated in FIG. 3, except for the driving transistor DRT, and the transistors Tup and Tdown and transistors in the control switch circuit CSC in each of the GIP gate driver circuits GDC in the non-active area of the OLED or LCD panel PNL illustrated in FIG. 5 can be implemented as the transistor TR illustrated in FIG. 6, 9, or 12.

The driving transistor DRT in each of the subpixels SP in the active area A/A of the OLED panel PNL illustrated in FIG. 3 and the switching transistor L-SWT in each of the subpixels SP in the active area A/A of the OLED panel PNL illustrated in FIG. 4 can be implemented as the transistor TR illustrated in FIG. 6, 9, or 12. In this situation, a structure by which the source electrode S or the drain electrode D is connected to the pixel electrode PXL can further be included. Hereinafter, the connection structure of the pixel electrode PXL will be described. In the following description, a situation in which the drain electrode D is connected to the pixel electrode PXL will be taken by way of example, for the sake of brevity. However, the source electrode S can be connected to the pixel electrode PXL, depending on the circuit design.

Figure 15:
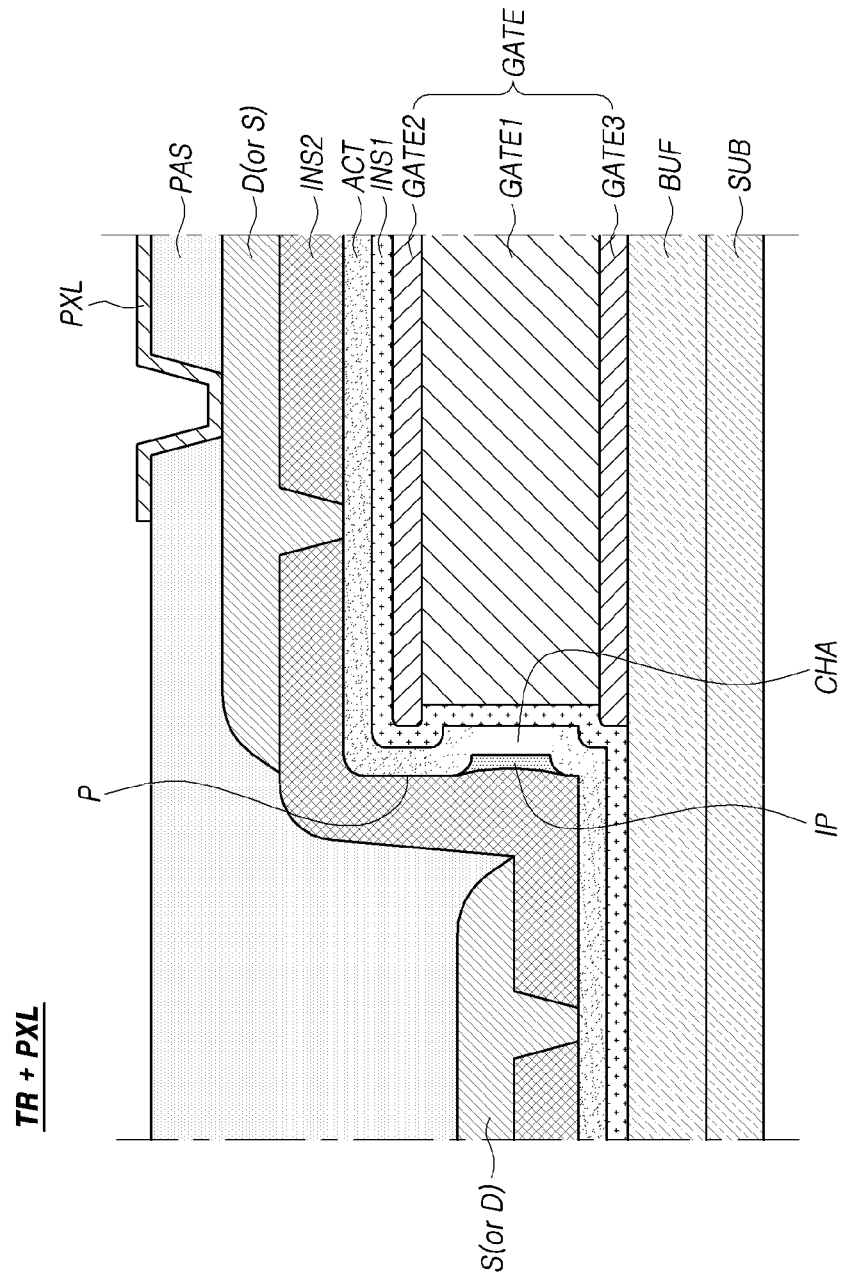
FIG. 15 illustrates a structure connecting the vertical type transistor to a pixel electrode according to embodiments, disposed in a subpixel.

FIG. 15 illustrates a structure connecting the transistor having a vertical structure according to embodiments to a pixel electrode, in a subpixel.

Referring to FIG. 15, among the transistors TR having a vertical structure disposed in a subpixel SP in the active area A/A, there can be a transistor DRT or L-SWT, the drain electrode D of which is electrically connected to the pixel electrode PXL.

Referring to FIG. 15, a passivation layer PAS can be provided to cover the source electrode S and the drain electrode D of the transistor TR.

In addition, the pixel electrode PXL can be located on the passivation layer PAS. The pixel electrode PXL can be connected to the source electrode S or the drain electrode D via a hole in the passivation layer PAS.

In a situation in which the panel PNL is an OLED panel, as illustrated in FIG. 3, a data voltage can be applied to the gate electrode GATE, since the transistor TR is electrically connected to the pixel electrode PXL and is a driving transistor DRT.

In addition, in a situation in which the panel PNL is an LCD panel, as illustrated in FIG. 4, a data voltage can be applied to the pixel electrode PXL, since the transistor TR is a switching transistor L-SWT that is electrically connected between the data line DL and the pixel electrode PXL.

Although the transistor TR according to the present disclosure is illustrated as being disposed in the active area A/A in FIG. 15, the transistor TR according to embodiments can be disposed in the non-active area located in the periphery of the panel PNL.

In addition, although the configuration, in which the transistor TR having a vertical structure is the transistor TR of FIG. 12, is illustrated in FIG. 15 for the sake of brevity, embodiments are not limited thereto. Rather, the transistor TR of FIG. 6 or FIG. 9 can be used in place of the transistor TR of FIG. 15.

Figure 16:
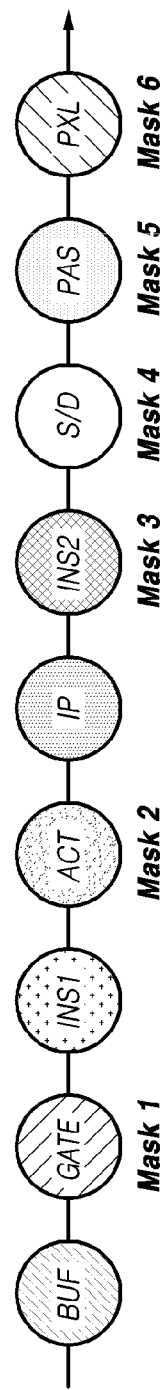
FIG. 16 illustrates a process flow of the panel in a situation in which the transistor having a vertical structure according to embodiments is disposed in a subpixel.

FIG. 16 illustrates a process flow of the panel PNL in a situation in which the transistor TR having a vertical structure according to embodiments is disposed in a subpixel SP.

Referring to FIG. 16, in the process of fabricating the panel PNL including the transistor TR having a vertical structure according to embodiments, the buffer layer BUF and the first insulating film INS1 are deposited to the substrate SUB by front side deposition without mask processing.

Thus, in the panel fabrication process, six (6) mask processes for sequentially fabricating (patterning) the gate electrode GATE, the active layer ACT, the second insulating film INS2, the source and drain electrodes S and D, the passivation layer PAS, and the pixel electrode PXL are used.

According to an embodiment, a separate mask process for patterning the insulation pattern IP is not required. The process of fabricating the active layer ACT and the insulation pattern IP will be described hereinafter with reference to FIG. 17.

Figure 17:
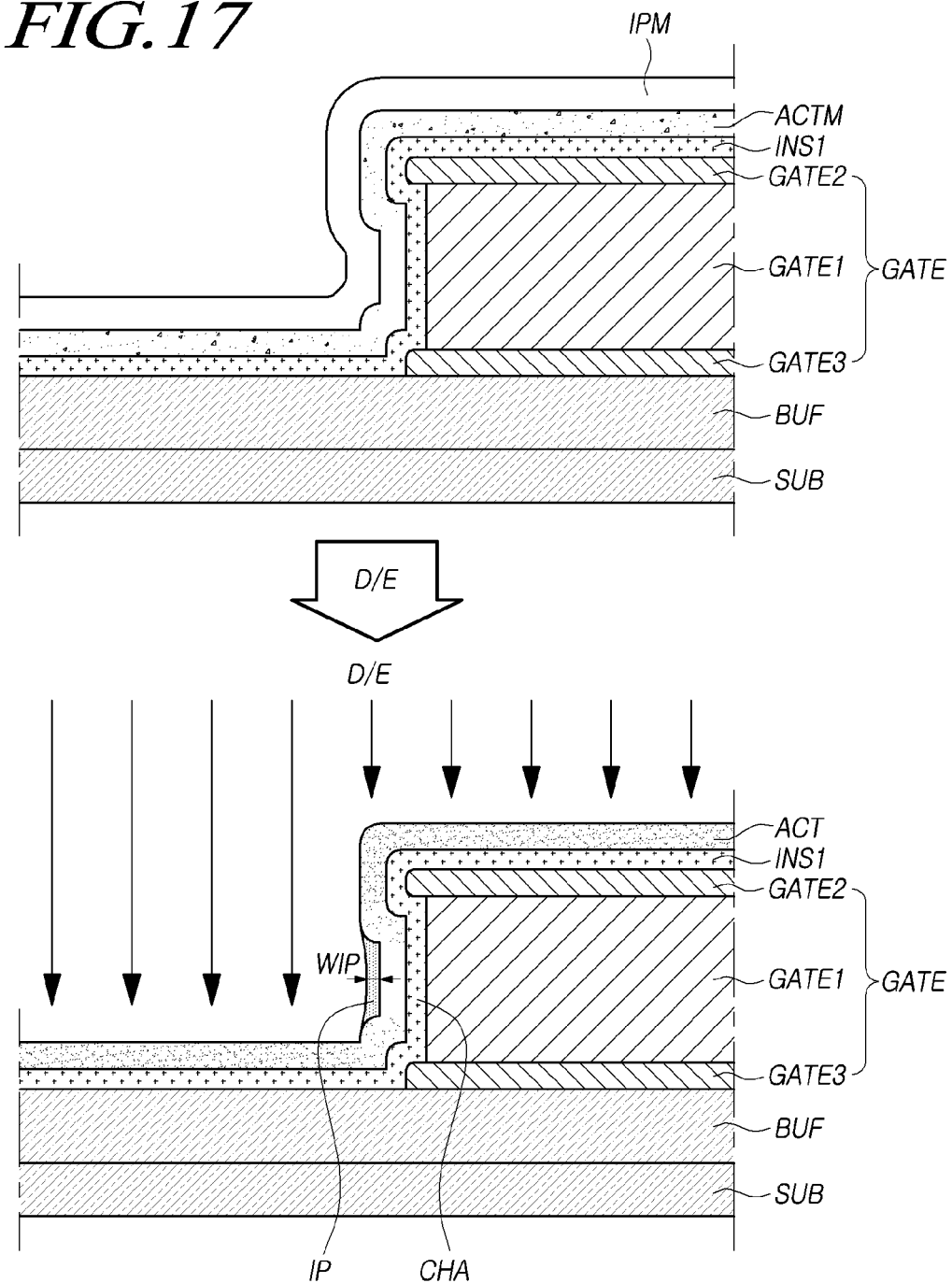
FIG. 17 schematically illustrates a process of fabricating the active layer and the insulation pattern according to embodiments.

FIG. 17 schematically illustrates the process of fabricating the active layer and the insulation pattern according to embodiments.

Referring to FIG. 17, the buffer layer BUF, the gate electrode GATE, and the first insulating film INS1 are sequentially fabricated on the substrate SUB.

An active layer material ACTM and an insulation pattern material IPM are provided on the substrate SUB including the first insulating film INS1.

Here, the material of the first insulating film INS1 and the active layer material ACTM can be provided by the MOCVD or ALD method.

In addition, the insulation pattern material IPM can be provided by the MOCVD or ALD method. In some situations, the insulation pattern material IPM can be provided by a typical PVD or CVD method.

Afterwards, the active layer material ACTM and the insulation pattern material IPM are patterned into the shape of the active layer ACT by the mask process Mask 2.

In addition, after the mask process Mask 2, dry etching is performed using plasma or the like to remove the residue of the insulation pattern material IPM from the active layer material ACTM.

The entirety of the insulation pattern material IPM exposed to plasma is removed. In this situation, the active layer material ACTM has a protruding portion due to the protrusion of the first gate electrode GATE1. The protruding portion of the active layer material ACTM protects the insulation pattern material IPM, present below the active layer material ACTM, from plasma.

Finally, only the insulation pattern material IPM, present below the protruding portion of the active layer material ACTM, is left to form the insulation pattern IP.

In addition, while the active layer material ACTM having the insulation pattern IP is protected from plasma, the remaining portion of the active layer material ACTM is exposed to plasma to be conductive after the insulation pattern material IPM is removed.

Accordingly, the active layer ACT can be produced, with the remaining portion thereof except for the channel area CHA being processed to be conductive.

In addition, referring to the structure of the transistor TR according to embodiments, at least one side surface of the gate electrode has a reverse tapered shape or at least one stepped portion is provided on at least one side surface of the gate electrode, such that the active layer material ACTM has the protruding portion.

Since an area is covered with the protruding portion of the active layer material ACTM, an area of the active layer material ACTM is not affected by plasma during plasma processing. This area can be the area in which the insulation pattern IP is fabricated or can be an area of the active layer ACT, which is not processed to be conductive by plasma, e.g., the channel area CHA.

Due to this process, the active layer ACT can be provided with the channel area CHA having a short length (e.g., the channel area is shielded from processing by the eave/protrusion or overhang portion).

The length of the channel area CHA of the active layer ACT, fabricated by the above-described process, can be shorter than the height of the gate electrode GATE. As described above, the channel area CHA is the area of the active layer material ACTM, which is covered with the protruding portion of the active layer material ACTM, formed due to the gate electrode GATE, and thus is not processed to be conductive by plasma. Thus, the length of the channel area CHA can be obtained by subtracting a height, which can correspond to the height of the protrusion of the gate electrode GATE, from at least the height of the gate electrode GATE.

In addition, the width WIP of the insulation pattern IP, fabricated by this process, may not be uniform. The width WIP of the insulation pattern IP is determined by a position-specific length taken in a direction parallel to the substrate SUB.

As described above, the process of fabricating the active layer ACT and the insulation pattern IP is performed based on a single mask process, so that the effect of process simplification can be obtained.

According to embodiments, even in the situation that the active layer ACT and the first insulating film INS1 are fabricated to have very thin thicknesses, the transistor having a vertical structure and the electronic device can be fabricated by the MOCVD or ALD method, such that no break is created.

The MOCVD or ALD method is a deposition method by which a thin film having excellent step-coverage properties can be fabricated. The resultant thin film can have higher thickness and composition uniformity, as well as a higher level of density, compared to those fabricated by other deposition methods.

According to embodiments, in the transistor having a vertical structure and the electronic device, the contact resistance between the source electrode S and the active layer ACT and between the drain electrode D and the active layer ACT can be lowered, since the source electrode S and the drain electrode D are connected to the active layer ACT via the contact holes formed in the second insulating film INS2.

According to embodiments, in the transistor having a vertical structure and the electronic device, the short channel of the active layer ACT can be realized, and the device area can be reduced.

According to embodiments, in the transistor having a vertical structure and the electronic device, unnecessary parasitic capacitance can be reduced, since the source electrode S and the drain electrode D do not overlap.

According to embodiments, in the transistor having a vertical structure and the electronic device, advantageous effects, such as superior process convenience, channel damage protection, a short channel, and device miniaturization can all be realized.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principles of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. An electronic device comprising:
   a panel;
   a driver circuit configured to drive the panel; and
   a transistor disposed in the panel, the transistor including:
   a gate electrode disposed on a substrate,
   a first insulating film disposed on the gate electrode,
   an active layer disposed on the first insulating film, the active layer including:
   a first portion of the active layer overlapping with an upper surface of the gate electrode,
   a second portion of the active layer extending from the first portion, being disposed along a side surface of the gate electrode and including a channel area, and a third portion of the active layer extending from the second portion of the active layer, the third portion of the active layer being disposed on a portion of the first insulating film that does not overlap with the gate electrode, a second insulating film disposed on the active layer, a first electrode disposed on the second insulating film, the first electrode being electrically connected to the first portion of the active layer, a second electrode disposed on the second insulating film, the second electrode being electrically connected to the third portion of the active layer, and an insulation pattern disposed between the active layer and the second insulating film, in an area corresponding to the side surface of the gate electrode.

2. The electronic device according to claim 1, wherein the side surface of the gate electrode has a reverse tapered shape or the gate electrode has a stepped portion located in an area corresponding to the second portion of the active layer.

3. The electronic device according to claim 2, wherein the gate electrode has a single-layer structure, and
wherein a width of the gate electrode increases in a direction away from the substrate.

4. The electronic device according to claim 1, wherein the insulation pattern overlaps the channel area of the active layer.

5. The electronic device according to claim 1, wherein a width of the insulation pattern is wider than a width of the channel area of the active layer.

6. The electronic device according to claim 1, wherein the gate electrode has a multi-layer structure.

7. The electronic device according to claim 6, wherein the gate electrode includes a first gate electrode and a second gate electrode disposed on the first gate electrode, and
wherein a width of the first gate electrode is narrower than a width of the second gate electrode.

8. The electronic device according to claim 7, wherein a material of the first gate electrode differs from a material of the second gate electrode.

9. The electronic device according to claim 7, wherein the channel area of the active layer is disposed to correspond to a portion of a side surface of the first gate electrode.

10. The electronic device according to claim 7, wherein the gate electrode further includes a third gate electrode disposed under the first gate electrode, and
wherein the width of the first gate electrode is narrower than a width of the third gate electrode.

11. The electronic device according to claim 10, wherein a material of the first gate electrode differs from both a material of the second gate electrode and a material of the third gate electrode.

12. The electronic device according to claim 1, wherein one of the first electrode and the second electrode overlaps with an upper surface of the gate electrode.

13. The electronic device according to claim 1, wherein the first electrode and the second electrode do not overlap with each other.

14. The electronic device according to claim 1, wherein the first insulating film is denser than the second insulating film, and
wherein the first insulating film has less thickness variation than the second insulating film or the first insulating film has a more uniform thickness than the second insulating film.

15. The electronic device according to claim 1, wherein the active layer includes an amorphous silicon semiconductor or an oxide semiconductor.

16. The electronic device according to claim 1, wherein the transistor is disposed in an active area of the panel,
wherein a passivation layer covers a source electrode and a drain electrode of the transistor, and
wherein a pixel electrode is located on the passivation layer to be electrically connected to the source electrode or the drain electrode via a hole in the passivation layer.

17. The electronic device according to claim 1, wherein each of a plurality of subpixels in an active area of the panel includes the transistor of claim 1.

18. The electronic device according to claim 1, wherein the transistor is included in a gate driver circuit disposed in a non-active area of the panel, in a periphery of the active area.

19. A transistor having a vertical structure, comprising:
a gate electrode disposed on a substrate;
a first insulating film disposed on the gate electrode;
an active layer disposed on the first insulating film, the active layer including:
a first portion of the active layer overlapping with an upper surface of the gate electrode,
a second portion of the active layer extending from the first portion, being disposed along a side surface of the gate electrode and including a channel area, and
a third portion of the active layer extending from the second portion, the third portion of the active layer being disposed on a portion of the first insulating film that does not overlap with the gate electrode;
a second insulating film disposed on the active layer;
a first electrode disposed on the second insulating film, the first electrode being electrically connected to the first portion of the active layer;
a second electrode disposed on the second insulating film, the second electrode being electrically connected to the third portion of the active layer; and
an insulation pattern disposed between the active layer and the second insulating film,
wherein the insulation pattern overlaps the channel area of the active layer.

20. The transistor according to claim 19, wherein the side surface of the gate electrode has a reverse tapered shape, or the gate electrode has a stepped portion located in an area corresponding to the second portion of the active layer.

21. The transistor according to claim 19, wherein the insulation pattern is disposed substantially parallel to the side surface of the gate electrode.

22. The transistor according to claim 19, wherein the insulation pattern is disposed under a protruding portion or an eave portion of the active layer.

23. The transistor according to claim 22, wherein the protruding portion or the eave portion of the active layer follows contours of a protruding portion of the first insulating layer, and
wherein the protruding portion of the first insulating layer follows contours of a protruding portion of the gate electrode.

24. The transistor according to claim 19, wherein the channel area of the active layer is disposed substantially parallel to the side surface of the gate electrode.

* * * * *